United States Patent
Nishitoba et al.

(10) Patent No.: US 7,173,582 B2
(45) Date of Patent: Feb. 6, 2007

(54) CURRENT DRIVE CIRCUIT AND IMAGE DISPLAY DEVICE

(75) Inventors: Shigeo Nishitoba, Tokyo (JP); Kouichi Iguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 225 days.

(21) Appl. No.: 10/516,105

(22) PCT Filed: Jul. 31, 2003

(86) PCT No.: PCT/JP03/09719

§ 371 (c)(1),
(2), (4) Date: Nov. 30, 2004

(87) PCT Pub. No.: WO2004/013834

PCT Pub. Date: Dec. 2, 2004

(65) Prior Publication Data

US 2005/0174307 A1 Aug. 11, 2005

(30) Foreign Application Priority Data

Aug. 2, 2002 (JP) ............................. 2002-225919

(51) Int. Cl.
*G09G 3/30* (2006.01)
(52) U.S. Cl. ........................ 345/76; 345/80; 345/211; 315/169.3
(58) Field of Classification Search ............ 345/76–79, 345/80, 211; 315/169.3
See application file for complete search history.

(56) References Cited

U.S. PATENT DOCUMENTS

| | | | |
|---|---|---|---|
| 6,091,203 A | 7/2000 | Kawashima et al. | |
| 6,229,506 B1 | 5/2001 | Dawson et al. | |
| 6,914,390 B2 * | 7/2005 | Koyama | 315/169.3 |
| 7,046,220 B2 * | 5/2006 | Tagawa et al. | 345/76 |
| 2003/0030602 A1 * | 2/2003 | Kasai | 345/76 |
| 2003/0133243 A1 | 7/2003 | Imamura | |
| 2004/0222749 A1 * | 11/2004 | Koyama | 315/169.3 |

FOREIGN PATENT DOCUMENTS

| | | |
|---|---|---|
| JP | 5-035202 | 2/1993 |
| JP | 11-282419 | 10/1999 |
| JP | 2001-042882 A | 2/2001 |
| JP | 2001-142427 A | 5/2001 |
| WO | WO 98/48403 | 4/1998 |
| WO | WO 03/019517 A1 | 3/2003 |

* cited by examiner

*Primary Examiner*—Amr A. Awad
*Assistant Examiner*—Seokyun Moon
(74) *Attorney, Agent, or Firm*—Foley & Lardner LLP

(57) ABSTRACT

The present invention provide a display panel including a current-driven displaying elements arrayed therein, and a display device, which suppress the deterioration in the representation accuracy of grayscale levels of pixels, resulting from the variation in transistors formed within the display panel. A display panel according to the present invention is composed of a current-driven display element, a constant current control line, a constant current line, a current hold circuit, a switch circuit connected between said current-driven display element and said current hold circuit, a data line transmitting a data signal having a waveform corresponding to a grayscale level, and a control circuit provided with said data signal. Said current hold circuit outputs, when said constant current control line is deactivated, a drive current having an intensity substantially identical to that of a constant current provided thereto through said constant current line in the case that said constant current control line is activated. Said control circuit turns on and off said switch circuit in response to said data signal.

20 Claims, 27 Drawing Sheets

Fig. 9

| GRAYSCALE LEVEL | CONDUCTION TIME |
|---|---|
| 15 | $t4+t3+t2+t1$ |
| 14 | $t4+t3+t2$ |
| 13 | $t4+t3+t1$ |
| 12 | $t4+t3$ |
| 11 | $t4+t2+t1$ |
| 10 | $t4+t2$ |
| 9 | $t4+t1$ |
| 8 | $t4$ |
| 7 | $t3+t2+t1$ |
| 6 | $t3+t2$ |
| 5 | $t3+t1$ |
| 4 | $t3$ |
| 3 | $t2+t1$ |
| 2 | $t2$ |
| 1 | $t1$ |
| 0 | 0 |

CURRENT DRIVE CIRCUIT AND IMAGE DISPLAY DEVICE

TECHNICAL FIELD

The present invention is related to current drive circuits and image display devices, and more particularly, to display panels and image display devices, including current-driven display elements and current drive circuits for driving the same.

BACKGROUND ART

The organic EL display, composed of an array of organic electro-luminescence elements (organic EL elements), is one of the promising display devices from various advantages. Organic EL displays can be operated on reduced direct current voltages, and achieves high efficiency, namely, high brightness. Moreover, organic EL displays exhibit higher response speed than liquid crystal displays, and improved temperature characteristics at low temperatures. Additionally, organic EL displays achieve improved visibility through self light emitting, and therefore do not require backlights, differently from liquid crystal displays. The fact that no backlight is required preferably makes displays thinner.

Among passive and active matrix methods, which are known as driving methods of organic EL displays, the active matrix method is a promising driving method of organic EL displays. The active matrix method designates a method that involves providing TFTs (Thin Film Transistor) on display panels to activate organic EL elements. The active matrix method, which exhibits excellent light emission efficiency, is expected to achieve high image quality. Additionally, the active matrix method achieves extension of display lifetime through reduction in drive currents of organic EL elements, Japanese Laid Open Patent Application (JP-A-Heisei, 11-282410) discloses a driving circuit of organic EL elements for an active matrix method. FIG. 1 is a circuit diagram of the disclosed driving circuit. The driving circuit is composed of n-channel transistors 131, 132, a capacitor element 133, and switches 134, 135. TFTs are used as the n-channel transistors 131, 132. The n-channel transistors 131, and 132 form a current mirror. This current mirror is supplied with a signal current corresponding to the brightness of an organic EL element 103 from a signal line 104. The current mirror generates a drive current for driving the organic EL element 103 in response to the supplied signal current.

One problem of this driving circuit is that the generated drive current may not correspond to the signal current due to the non-uniformity of the properties of the n-channel transistors 131, and 132. TFTs, which are used as the n-channel transistors 131, 132, tend to exhibit increased non-uniformity, differently from transistors integrated within a silicon single crystal; TFTs suffer from increased variance in carrier mobilities, film thicknesses of gate dielectrics, and threshold voltages. Even for a pair of adjacent TFTs, the threshold voltages thereof may be different by about several 10 mV. The variation in the properties of the n-channel transistors 131, and 132 may cause non-uniformity in brightnesses of a plurality of organic EL elements 103, that is, a plurality of pixels, for the same signal current to be supplied thereto. This undesirably deteriorates the image quality of the display panel.

Another problem of the driving circuit is that the drive current supplied to the organic EL element 103 may be nonlinear with respect to the signal current, because of a parasitic capacitance 136 of the signal line 104. A part of the signal current is used to charge the parasitic capacitance 136 of the signal line 104, and not supplied to the current mirror. The part of the signal current used to charge the parasitic capacitance 136 does not contribute to the driving current. For a minute signal current, in particular, the part exhausted to charge the parasitic capacitance 136 cannot be ignored. As a result, as shown in FIG. 2, the drive current $I_{out}$ exhibits nonlinearity with respect to a signal current $I_{in}$. The nonlinearity of the drive current $I_{out}$ prevents a low grayscale level from being accurately represented, and degrades the image quality of the display panel.

The influence of the nonlinearity of the drive current $I_{out}$ is important to the active matrix method in which the signal current is relatively small. In the active matrix method, the drive current supplied to the organic EL elements ranges between $\frac{1}{50}$ and $\frac{1}{100}$ of the drive current of the passive matrix method; the minimum drive current ranges between several nA and ten-odd nA. The small drive current may cause a trouble that the charging of the parasitic capacitance 136 is not completed in one frame, which disables the pixels to represent the low brightness.

Japanese Laid Open Patent Application (JP-A-Heisei, 5-35202) discloses a drive circuit adapted to the active matrix method, in order to suppress the influence caused by the variation in properties of elements. Nevertheless, the drive circuit is adapted to drive a voltage-driven liquid crystal; the drive circuit does not solve the above-mentioned problems.

DISCLOSURE OF INVENTION

Therefore, an object of the present invention is to provide a display panel including a current-driven displaying elements arrayed therein and a display device, which suppress the deterioration in the representation accuracy of grayscale levels of pixels, resulting from the variation in transistors formed within the display panel.

Another object of the present invention is to provide a display panel including a current-driven displaying elements arrayed therein and a display device, which suppress the deterioration in the representation accuracy of grayscale levels of the pixels, resulting from parasitic capacitances of signal lines formed within the display panel.

A display panel according to the present invention is composed of a current-driven display element, a constant current control line, a constant current line, a current hold circuit, a switch circuit connected between said current-driven display element and said current hold circuit, a data line transmitting a data signal having a waveform corresponding to a grayscale level, and a control circuit provided with said data signal. Said current hold circuit outputs, when said constant current control line is deactivated, a drive current having an intensity substantially identical to that of a constant current provided thereto through said constant current line in the case that said constant current control line is activated. Said control circuit turns on and off said switch circuit in response to said data signal. Said current-driven display element is typically an organic EL element.

The structure of this display panel is effective for eliminating the influence of the variance in the properties of transistors formed thereon, and effectively improving the image quality of the display device. The display panel is driven by providing the current-driven display element with a drive current having an intensity identical to that of the constant current. The grayscale level of the current-driven display element is controlled by a waveform of the data signal, that is, the duration while the drive current is provided for the current-driven display element. The display panel such constructed allows the constant current developed through the constant current line to be increased to such a degree that a current necessary for charging a parasitic capacitor is negligible. Therefore, the display panel in this embodiment easily eliminates the influence of the parasitic capacitor of the constant current line.

Such structure is especially effective in the case that all of the transistors contained within said current hold circuit, said switch circuit, and said control circuit are TFTs.

When the display panel additionally includes additional switch circuit connected between said constant current line and said current hold circuit, and said current hold circuit is connected to a power supply terminal, it would be preferable that said additional switch circuit electrically connects said constant current line with said current hold circuit, and thereby allows said constant current to flow from said power supply terminal to said constant current line through said current hold circuit.

all MOS transistors contained within said current hold circuit, said switch circuit, said additional switch circuit, and said control circuit preferably have the same conductivity type.

When said additional switch circuit includes a first MOS transistor, a first source/drain of said first MOS transistor is connected to said constant current line, a second source/drain of said first MOS transistor is connected to said current hold circuit, and a gate of said first MOS transistor is connected to said constant current control line.

When said current hold circuit includes a drive MOS transistor, a first capacitor element, a second MOS transistor, then a source of said drive MOS transistor is connected to a power supply terminal, a drain of said drive MOS transistor is connected to said switch circuit and said additional switch circuit; said first capacitor element is connected between a gate and source of said drive MOS transistor; a source and a drain of said second MOS transistor are connected to said gate and drain of said drive MOS transistor, respectively; and a gate of said second MOS transistor is connected to said constant current control line.

It would be preferable that said constant current flows from said power supply terminal to said constant current line through said drive MOS transistor, said additional switch circuit, and thereby said first capacitor element is charged to a source-to-gate voltage of said drive MOS transistor, and said constant current is supplied for said current hold circuit multiple times for one frame period.

For example, said constant current is preferably supplied for said current hold circuit every time said data signal is provided for said control circuit.

When said current hold circuit additionally includes a third MOS transistor, said third MOS transistor has a first source/drain connected to said drain of said drive MOS transistor, a first source/drain of said third MOS transistor is connected to said switch circuit, and said third MOS transistor has a gate connected to said constant current control line.

Moreover, when the display panel further includes a sub constant current control line having a potential complementary to a potential on said constant current control line, and said current hold circuit additionally includes a third MOS transistor, it would be preferable that said third MOS transistor has a first source/drain connected to said drain of said drive MOS transistor, a second source/drain connected to said switch circuit, and a gate connected to said sub constant current control line, and conductivity types of said first MOS transistor, said second MOS transistor, and said third MOS transistor are same. Such structure is effective for allowing MOS transistors formed on the display panel to have the same conductivity type.

When the display panel further includes a data-line control line connected to said control circuit, it is preferable that said control circuit is composed of a potential hold circuit outputting a potential substantially identical to a potential of said data signal from a signal output when said data line control line is activated, and holding a potential on said signal output when said data line control line is deactivated, and that said switch circuit is turned on and off, in response to said potential on said signal output of said potential hold circuit.

When said switch circuit includes a fourth MOS transistor and said potential hold circuit is composed of a fifth MOS transistor, and a second capacitor element, a first source/drain of said fourth MOS transistor is connected to said current hold circuit, a second source/drain of said fourth MOS transistor is connected to said current-driven display element, a first source/drain of said fifth MOS transistor is connected to said data line, a second source/drain of said fifth MOS transistor is connected to said signal output, and a gate of said fifth MOS transistor is connected to said data-line control line, and said second capacitor element is connected between a power supply terminal and said signal output.

It would be effective for eliminating the influence of the parasitic capacitance of the constant current line that the display panel further includes a dummy circuit connected to said constant current line, and said dummy circuit is provided with said constant current through said constant current line during an inactive period while said constant current control line is deactivated.

In detail, it would be preferable that the display panel additionally includes a dummy constant current control line which is activated during an inactive period while said constant current control line is deactivated, that said dummy current includes a drive transistor, a first MOS transistor, and a second MOS transistor, said first MOS transistor having a first source/drain connected to said constant current line, and a gate connected to said dummy constant current control line, said drive MOS transistor having a source connected to a power supply terminal, and a drain connected to a second/source drain of said first MOS transistor, and said second MOS transistor having a source and a drain connected to a gate and said drain connected to said drive MOS transistor, respectively, and a gate connected to said dummy constant current control line.

It would be more preferable that said dummy pixel is provided with said constant current through said constant current line not during the whole of an inactive period while said constant current control line is deactivated, but during a predetermined period out of the inactive period immediately before said constant current control line is activated. It would be further preferable that said predetermined period is longer than a time constant of charging a parasitic capacitor of said constant current line.

A driving method according to the present invention is a method of driving a display panel including a current-driven display element, a drive MOS transistor, a capacitor element connected between a gate and a source of said drive MOS transistor, a first switch connected between a drain and said gate of said drive MOS transistor, and a second switch connected between said drain of said drive MOS transistor and the current-driven display element. The driving method is composed of:

a first step of developing a constant current through said drive MOS transistor with said first switch turned on and with said second switch turned off, a second step of providing a drive current for said current-driven display element with said first switch turned off and with said second switch turned on.

The driving method is especially useful for the case when said display panel further includes a constant current line, and said constant current is provided for said drive MOS transistor through said constant current line.

Said first step is preferably performed multiple times for one frame period.

The present invention suppresses the deterioration in the representation accuracy of grayscale levels of pixels, resulting from the variation in transistors formed within the display panel.

In another aspect, the present invention suppresses the deterioration in the representation accuracy of grayscale levels of the pixels, resulting from parasitic capacitances of signal lines formed within the display panel.

BRIEF DESCRIPTION OF DRAWINGS

FIG. 9 is a table showing a correspondence between the conduction time and the grayscale level of the pixel;

BEST MODE FOR CARRYING OUT THE INVENTION

The preferable embodiment of the present invention will be described below with reference to the attached drawings.

First Embodiment

Figure 3:
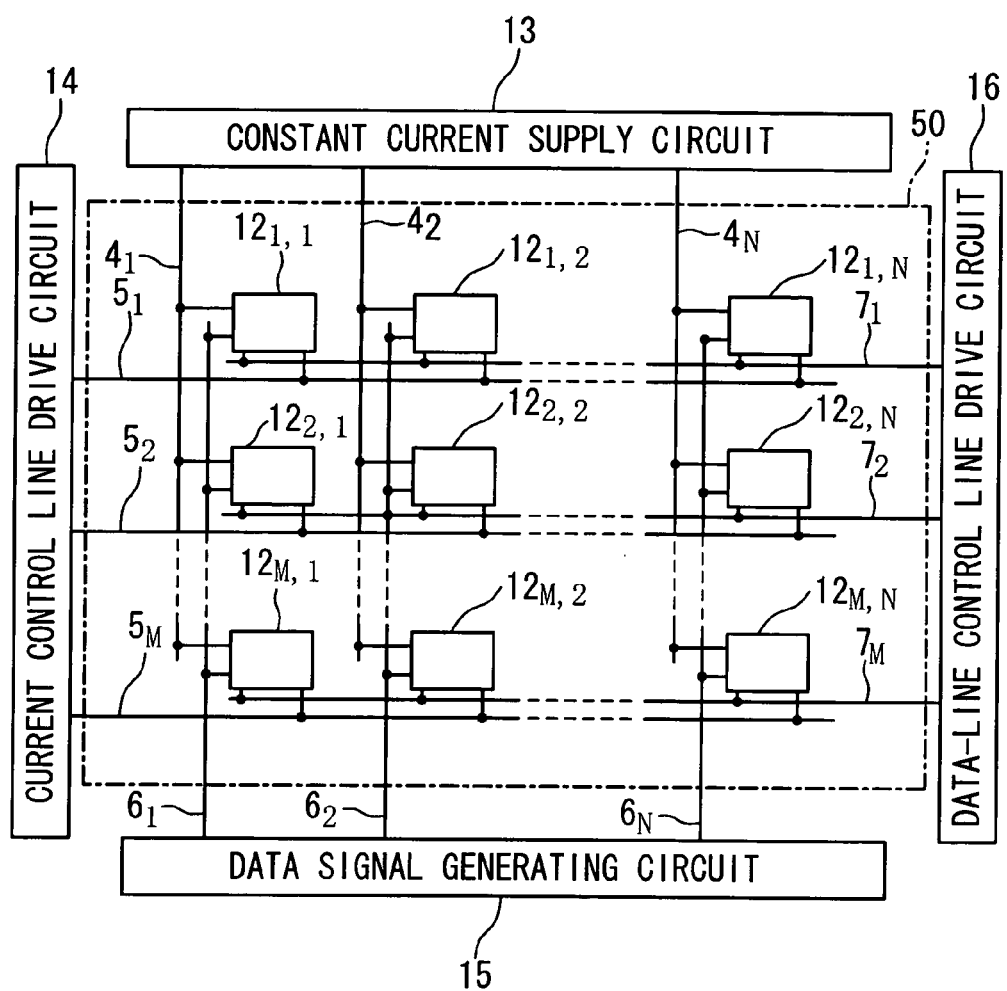
FIG. 3 is a circuit diagram illustrating a structure of a display device in a first embodiment of the present invention.

FIG. 3 shows a display device in a first embodiment of the present invention. The display device is provided with a display panel 50. The display panel 50 is composed of N constant current lines 4, M constant current control lines 5, N data lines 6, M data-line-control lines 7, and pixels 12 arrayed in M columns and N rows. The constant current lines 4, the constant current control lines 5, the data lines 6, the data-line-control lines 7 and the pixels 12 may be distinguished from each other with a subscript, if necessary. The constant current lines 4 and the data lines 6 are extended along an x-axis direction, and the constant current control lines 5 and the data-line control lines 7 are extended along a y-axis direction. A pixel $12_{i,j}$ is connected to a constant current line $4_j$, a constant current control line $5_i$, a data line $6_j$, and a data-line control line $7_i$. The constant current control lines 5 are low active, while the data lines 6 and the data-line control lines 7 are high active.

The constant current lines 4 are connected to a constant current supply circuit 13. The constant current control lines 5 are connected to a constant current control line drive circuit 14. The constant current control line drive circuit 14 scans and sequentially activates the constant current control lines 5. The constant current supply circuit 13 supplies the pixels 12 connected to the activated constant current control lines 5 with constant currents of a predetermined intensity in parallel, through the constant current lines 4.

The data lines 6 are connected to a data signal generating circuit 15, and the data-line control lines 7 are connected to a data-line control line drive circuit 16. The data-line control line drive circuit 16 scans and sequentially activates the data-line control lines 7. The data signal generating circuit 15 provides the pixels 12 connected to the activated constant current control lines 5 with data signals in parallel through the data lines 6. As described later, the data signals have waveforms corresponding to the grayscale levels of the pixels 12. When data signals are activated, each pixel 12 emits light in response to the activated data signals. The grayscale levels of the pixels 12 are controlled through time division drive.

Figure 4:
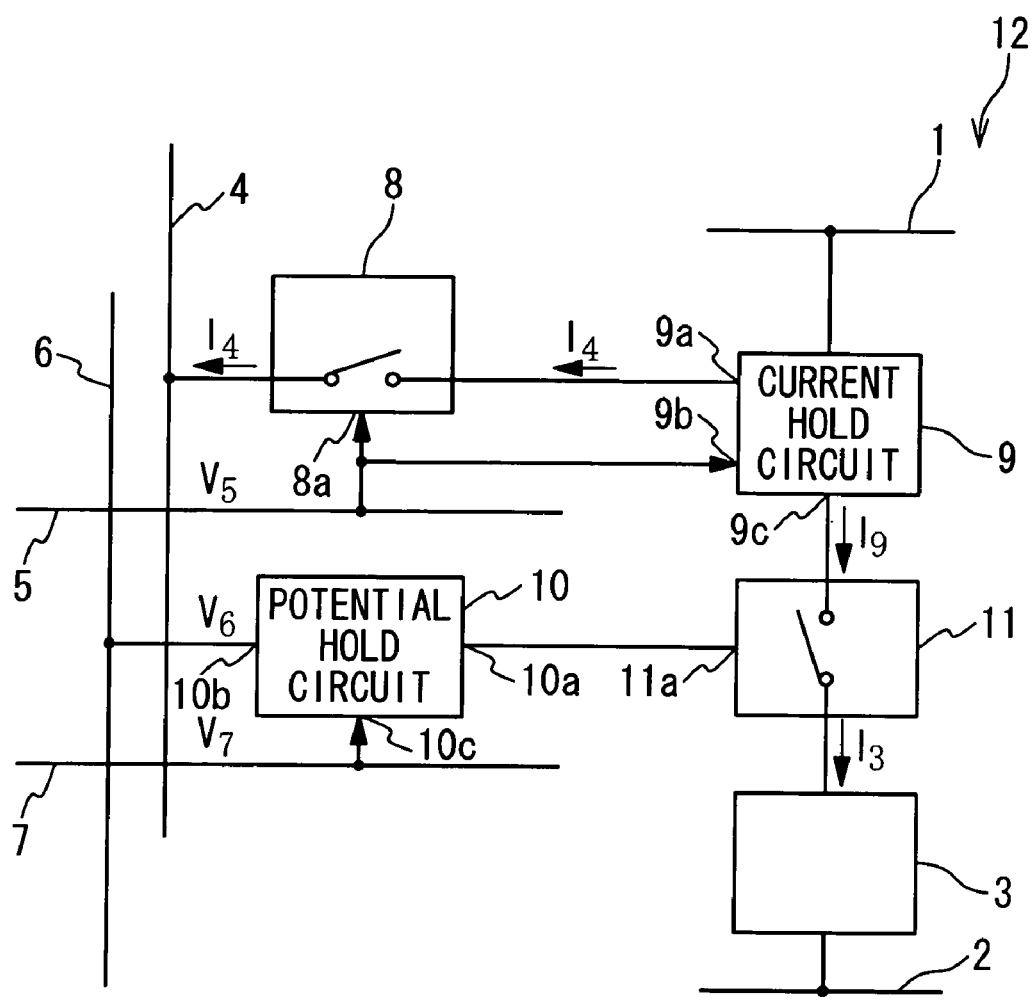
FIG. 4 is a circuit diagram illustrating a structure of a pixel of the display device in the first embodiment.

FIG. 4 is a block diagram illustrating the structure of the pixel 12. The pixel 12 is each composed of a power supply terminal 1, a ground terminal 2, an organic EL element 3, a switch 8, a current hold circuit 9, a potential hold circuit 10 and a switch 11. The current hold circuit 9, the switch 11, and the organic EL element 3 are connected in series between the power supply terminal 1 and the ground terminal 2. A current input 9a of the current hold circuit 9 is connected to the constant current line 4 through the switch 8. A control input 8a of the switch 8 and a control input 9b of the current hold circuit 9 are connected to the constant current control line 5. A control input 11a of the switch 11 is connected to a signal output 10a of the potential hold circuit 10. A signal input 10b of the potential hold circuit 10 is connected to the data line 6, and a control input 10c of the potential hold circuit 10 is connected to the data-line control line 7. The current hold circuit 9 is configured to, while the constant current control line 5 is deactivated, output a drive current having an intensity substantially equal to that of the constant current supplied thereto in the case that the constant current control line 5 is activated, from a current output 9c. The potential hold circuit 10 functions as a control circuit for controlling the turn-on and turn-off of the switch 11. The potential hold circuit 10 is configured to develop on the signal output 10a a potential substantially equal to the potential of the data signal generated on the data line 6 while the data-line control line 7 is activated, and to hold the potential of the signal output 10a while the data-line control line 7 is deactivated.

Figure 5:
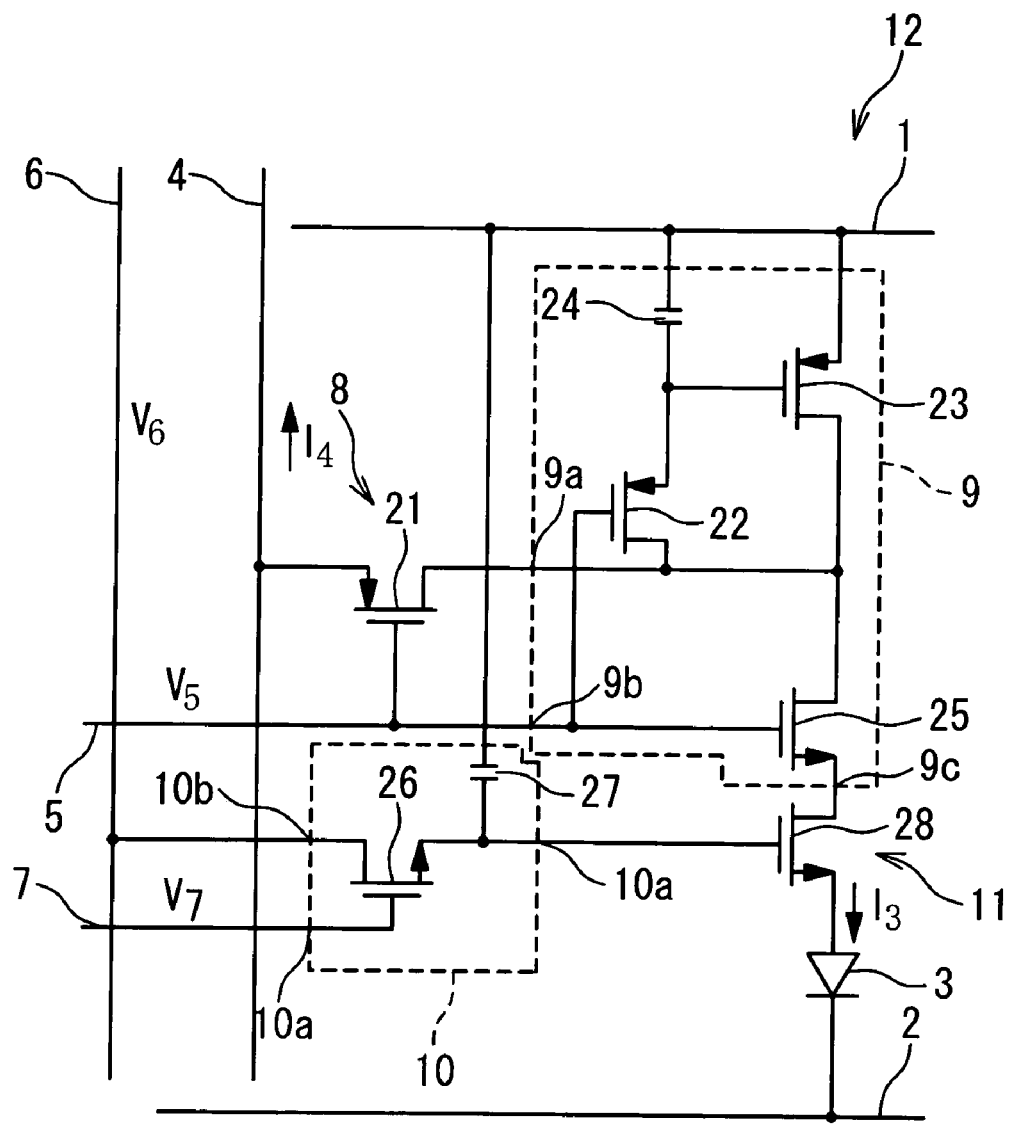
FIG. 5 shows the detailed structure of the pixel.

FIG. 5 shows a typical configuration of the switch 8, the current hold circuit 9, the potential hold circuit 10, and the switch 11. The switch 8 is composed of a p-channel MOS transistor 21. The p-channel MOS transistor 21 has a source connected to the constant current line 4, a gate connected to the constant current control line 5, and a drain connected to the current input 9a of the current hold circuit 9.

The current hold circuit 9 includes p-channel MOS transistors 22, 23, a capacitor element 24 and an N-channel MOS transistor 25. A source and a drain of the P-channel MOS transistor 22 are connected to a gate and a drain of the P-channel MOS transistor 23, respectively. A gate of the P-channel MOS transistor 22 is connected to the constant current control line 5. The P-channel MOS transistor 23 has a source connected to the power supply terminal 1, and a drain connected to a drain of the N-channel MOS transistor 25 and to the current input 9a. The capacitor element 24 is connected between the source and the gate of the P-channel MOS transistor 23. The N-channel MOS transistor 25 has a gate connected to the constant current control line 5, and a source connected to the current output 9c.

As described later, the intensity of the drive current supplied to the organic EL element 3 is dependent on the voltage between the source and gate of the P-channel MOS transistor 23. Therefore, the P-channel MOS transistor may be referred to as the drive transistor 23, hereinafter.

The potential hold circuit 10 includes an N-channel MOS transistor 26 and a capacitor element 27. The N-channel MOS transistor 26 has a drain connected to the data line 6, and a gate connected to the data-line control line 7. A source of the N-channel MOS transistor 26 is connected to the signal output 10a. The capacitor element 27 is connected between the source of the N-channel MOS transistor 26 and the power supply terminal 1.

The switch 11 includes an N-channel MOS transistor 28. The N-channel MOS transistor 28 has a drain connected to the current output 9c of the current hold circuit 9, and a source connected to the organic EL element 3. A gate of the N-channel MOS transistor 28 is connected to the signal output 10a of the potential hold circuit 10.

All of the above-mentioned P-channel MOS transistors 21 to 23 and N-channel MOS transistors 25, 26 and 28 are formed with TFTs.

Figure 6:
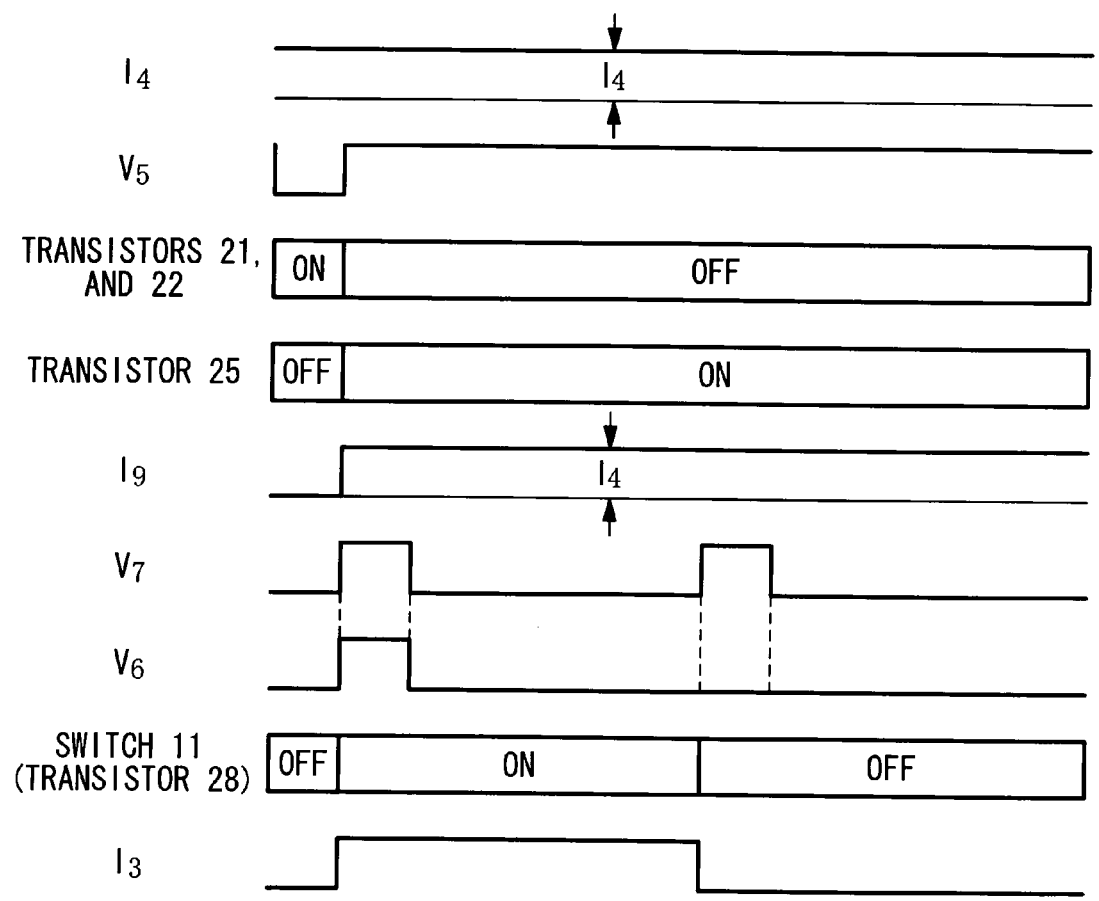
FIG. 6 is a timing chart illustrating operations of the display device in the first embodiment.

FIG. 6 is a timing chart showing operations of a certain pixel 12. The current hold circuit 9 is programmed with the constant current $I_4$ when the constant current control line 5, which is low active, is activated. In other words, in response to a potential $V_5$ of the constant current control line 5 being pulled down to the low level, the capacitor element 24 is charged to a voltage substantially equal to the source-to-gate voltage necessary for the drive MOS transistor 23 to develop the constant current $I_4$.

Programming the current hold circuit 9 with the constant current $I_4$ is achieved as follows. In response to the activation of the constant current control line 5, the switch 8 (that is, the P-channel MOS transistor 21) is turned on, and thereby the current hold circuit 9 is connected to the constant current line 4. Additionally, the P-channel MOS transistor 22 is turned on to thereby allow the drive MOS transistor 23 to be diode-connected. The N-channel MOS transistor 25 is turned off, and the drive MOS transistor 23 is electrically isolated from the organic EL element 3. Moreover, the constant current supply circuit 13 develops the constant current $I_4$ from the power supply terminal 1 to the constant current line 4 through the drive MOS transistor 23 and the switch 8. Forcedly developing the constant current $I_4$ through the drive MOS transistor 23 by the constant current supply circuit 13 achieves adjustment of the source-to-gate voltage of the drive MOS transistor 23 so that the drive MOS transistor 23 develops the constant current $I_4$ therethrough. This results in that the capacitor element 24 is charged to a voltage substantially equal to the source-to-gate voltage necessary for the drive MOS transistor 23 to develop the constant current $I_4$ therethrough.

Moreover, the intensity of the constant current $I_4$ is selected to be large enough to ignore the current required to charge the parasitic capacitance of the constant current line 4. In other words, the duration while the constant current $I_4$ flows is selected to be sufficiently larger than a time constant of charging the parasitic capacitance of the constant current line 4. This eliminates the influence of the parasitic capacitance of the constant current line 4.

The duration while the constant current $I_4$ flows is set to be sufficiently larger than a time constant of charging the capacitor element 24. This is important for charging the capacitor element 24 to the source to gate voltage necessary for the drive MOS transistor 23 to develop the constant current $I_4$, regardless of the properties of the TFTs constituting the pixel 12.

In response to the deactivation of the constant current line 5, the current hold circuit 9 is then placed into a "Hold State", that is, a state in which the drive current $I_9$ substantially equal to the constant current $I_4$ is outputable from the current output 9c. In response to the constant current line 5 being deactivated, namely, pulled up to the high level, the switch 8 (that is, the P-channel MOS transistor 21) is turned off, and the current hold circuit 9 is disconnected from the constant current line 4. Additionally, the P-channel MOS transistor 22 is turned off, and the capacitor element 24 holds the source-to-gate voltage necessary for the drive MOS transistor 23 to develop the constant current $I_4$. This results in that the source-to-gate voltage of the drive MOS transistor 23 is maintained at such a voltage that the drive MOS transistor 23 outputs the drive current $I_9$ equal to the constant current $I_4$. Moreover, the N-channel MOS transistor 25 is turned on, and the drive MOS transistor 23 is connected to the current output 9c. This allows the current hold circuit 9 to be placed into the state in which the drive current $I_9$ substantially equal to the constant current $I_4$ is outputable from the current output 9c.

Simultaneously with the deactivation of the constant current line 5, the data-line control line 7 is activated, namely, a potential $V_7$ of the data-line control line 7 is pulled up to the high level.

In response to the data-line control line 7 being activated, the potential hold circuit 10 is programmed with the data signal through the data line 6. In other words, the potential on the signal output 10a of the potential hold circuit 10 is driven to the potential of the data signal, and the capacitor element 27 is charged to the potential difference between the data signal and the power supply terminal 1. When the data signal is active, namely, if the data signal is set to the high level, the switch 11 (namely, the NMOS transistor 28) is turned on, and the current hold circuit 9 is connected to the organic EL element 3. The current hold circuit 9 supplies the drive current $I_9$, which is equal to the constant current $I_4$ to the organic EL element 3, and the organic EL element 3 emits the light. When the data signal is deactivated, the switch 11 (namely, the NMOS transistor 28) is turned off, and the organic EL element 3 does not emit light.

The data-line control line 7 is then deactivated. Even after the deactivation of the data-line control line 7, the potential on the signal output 10a of the potential hold circuit 10 is maintained at the potential of the data signal inputted to the potential hold circuit 10, due to the operation of the capacitor element 27. In response to the potential of the signal output 10a, the organic EL element 3 is kept emitting light or not emitting light. The potential on the signal output 10a of the potential hold circuit 10 is maintained until the data signal is newly inputted to the potential hold circuit 10 after the data-line control line 7 is next activated.

In order to achieve a desired grayscale level on the pixel 12, the organic EL element 3 is time-divisionally driven. The intensity of the drive current $I_9$ supplied to the organic EL element 3 is kept constant while the organic EL element 3 emits light; the grayscale level of the pixel 12 is not adjusted with the intensity of the drive current $I_9$.

Figure 7:
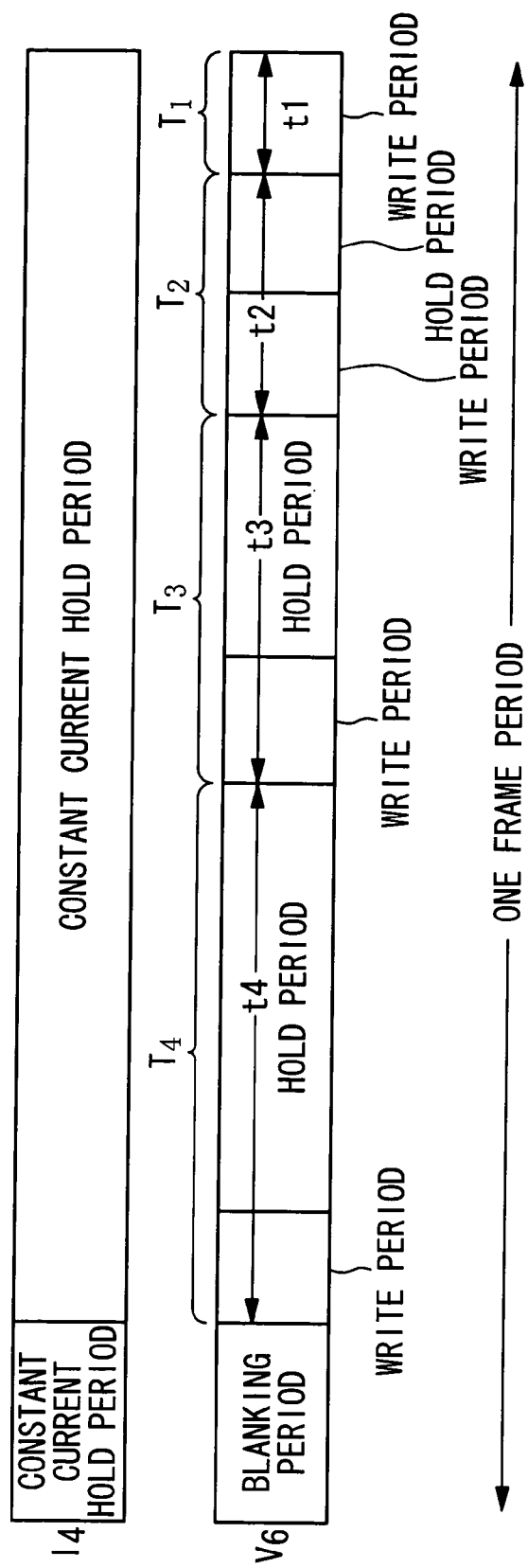
FIG. 7 is a timing chart illustrating a method of controlling the grayscale level of the pixel.

FIG. 7 is a timing chart showing the driving method of the organic EL element 3 for achieving the desired grayscale level on the organic EL element 3. One frame period is composed of a constant current write period, and a constant current hold period following it. Programming the current hold circuit 9 with the constant current $I_4$ is executed during the constant current write period; the drive current is not supplied for the organic EL element 3 during the constant current write period. That is, the constant current write period is the blanking period while the pixel 12 is not turned on.

The constant current hold period is divided into n periods $T_1$ to $T_n$ having lengths of $t_1$ to $t_n$, respectively. The $t_1$ to $t_n$ satisfy the following relation:

$$t_i = 2^{i-1} t_1 \quad (1)$$

where i is an integer between 1 and n. In this embodiment, n is 4.

The periods $T_1$ through $T_n$ are each composed of a write period and a hold period. During the write period, the data signal is provided to the potential hold circuit 10 through the data line 6. Additionally, the data-line control line 7 is activated, and the potential hold circuit 10 is programmed with the potential of the data signal. During the hold period, the data-line control line 7 is deactivated, and the written potential of the data signal is held on the signal output 10a of the potential hold circuit 10. When the activated data signal is inputted to the potential hold circuit 10 during the write period of a certain lightening period $T_i$, the drive current $I_9$ is supplied to the organic EL element 3 over the whole of the lightening period $T_i$ (namely, both of the write period and the hold period). When the deactivated data signal is inputted to the potential hold circuit 10, on the other hand, the drive current $I_9$ is not supplied to the organic EL element 3 during the period $T_i$.

The brightness of the pixel 12 is adjusted the length of the period while the organic EL element 3 is turned on. The data signal is generated so as to indicate during which period(s) the organic EL element 3 is turned on, out of the periods $T_1$ to $T_n$. In order to turn on the organic EL element 3 during the period $T_i$, the data signal is activated during the write period within the period $T_i$. In order to turn off the organic EL element 3 during the period $T_j$, the data signal is deactivated during the write period of the period $T_j$. In order to increase the brightness of the pixel 12, the data signal is generated and supplied to the potential hold circuit 10, so that the data signal has a waveform indicating that the drive current $I_9$ is supplied to the organic EL element 3 for a long period of time. In order to decrease the brightness of the pixel 12, in contrast, the data signal is generated so that the data signal has a waveform indicating that the drive current $I_9$ is supplied to the organic EL element 3 only for a short period of time.

Figure 8:
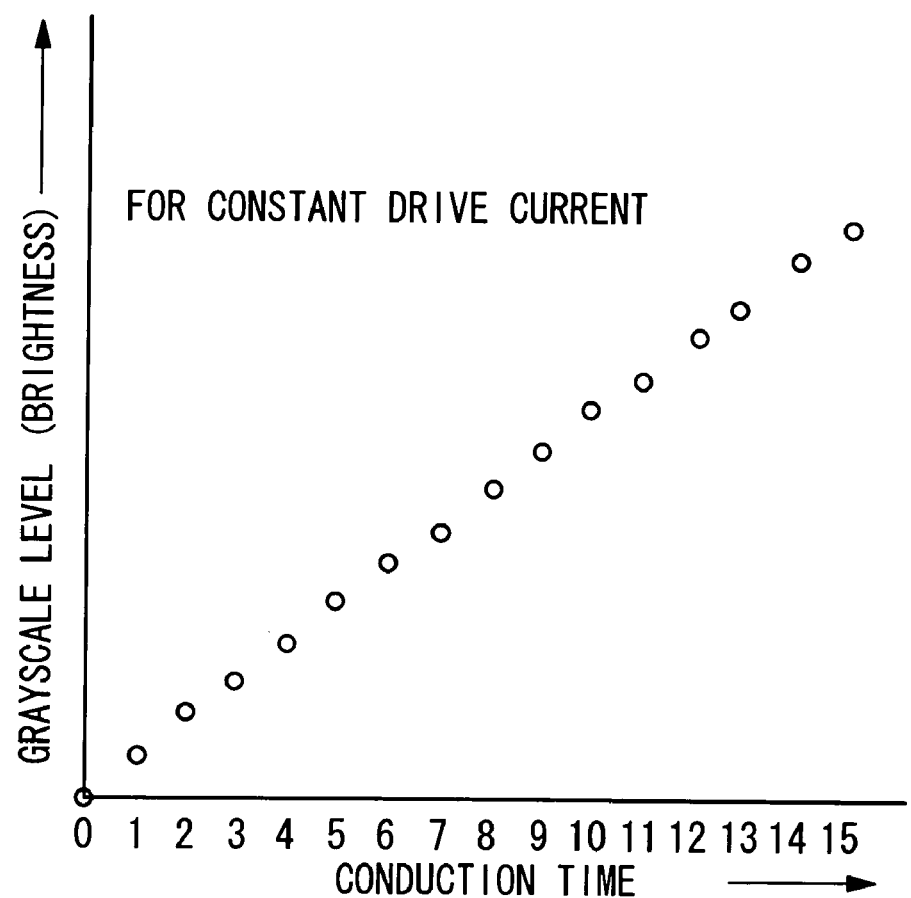
FIG. 8 is a graph illustrating a relation between a conduction time during which a drive current flows through an organic EL element and the grayscale level of the pixel.

Such operation enables the display device in this embodiment to represent $2^n$ grayscale levels. FIG. 8 is a graph showing the length of the supply time during which the drive current $I_9$ is supplied to the organic EL element 3, and the grayscale levels of the pixel 12, while FIG. 9 is a table showing the correspondence between the grayscale levels of a certain pixel 12 and the supply time. As shown in FIGS. 8 and 9, the brightness of the pixel 12 is increased through lengthening the supply time during which the drive current $I_9$ is supplied to the organic EL element 3, while the brightness of the pixel 12 is decreased through reducing the supply time.

The display panel in this embodiment eliminates the influence of the variation in the properties of TFTs, and effectively improves the image quality of the display device. Due to the configuration of the pixel 12 as mentioned above, the drive current $I_9$ supplied to the organic EL element 3 is substantially coincident with the constant current $I_4$ supplied to the pixel 12 from the constant current supply circuit 13. As mentioned above, programming the current hold circuit 9 with the constant current $I_4$ achieves charging the capacitor element 24 of the pixel 12 to the voltage necessary for the drive transistor 23 to drive the current substantially equal to the constant current $I_4$. While the drive current $I_9$ is supplied to the organic EL element 3, the source-to-gate voltage of the drive transistor 23 is maintained by the capacitor element 24 so that the drive current $I_9$ substantially equal to the constant current $I_4$ is outputted to the drive transistor 23. Therefore, the intensity of the drive current $I_9$ does not depend on the properties of the drive transistor 23 composed of TFTs; the intensity of the drive current $I_9$ is substantially equal to that of the constant current $I_4$. The brightness of the pixel 12 does not suffer from the influence of the variation in the properties of the drive transistor 23. Accordingly, the display panel in this embodiment effectively improves the image quality of the display device.

Additionally, the display panel in this embodiment eliminates the influence of the parasitic capacitance of the constant current line 4, and thereby achieves the desired gray-scale level on the pixel 12. In the display panel in this embodiment, the constant current $I_4$ developed through the constant current line 4 is increased to such a degree that the current required charging the parasitic capacitance of the constant current line 4 can be ignored. Accordingly, the display panel in this embodiment easily eliminates the influence of the parasitic capacitance of the constant current line 4.

Second Embodiment

Figure 10:
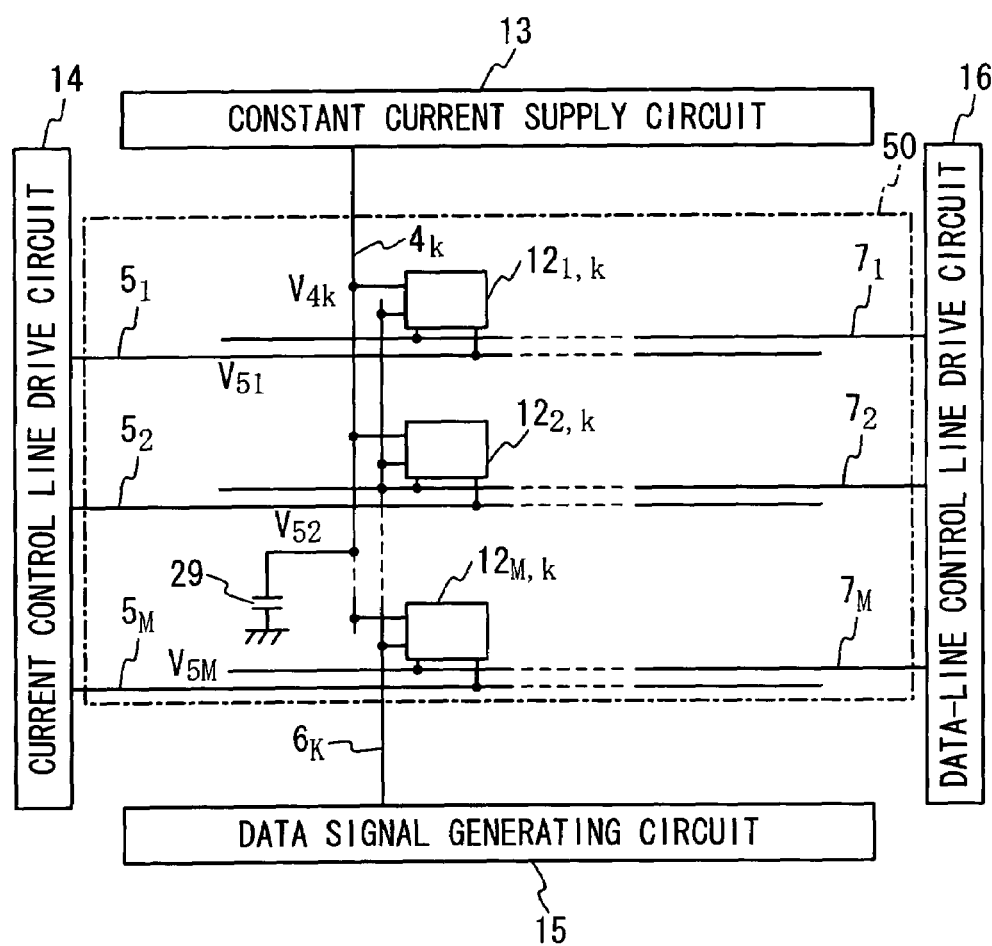
FIG. 10 is a circuit diagram partially illustrating the structure of the display device in the first embodiment in the present invention.

FIG. 10 is a diagram partially showing the display panel 50. FIG. 10 illustrates the pixels $12_{1,k}$ to $12_{M,k}$ on the k-th row of the display panel 50. The constant current lines 4, which intersect the constant current control lines 5, the data-line control lines 7, the power supply line and the ground line (not shown in FIG. 10), have a parasitic capacitance 29. The parasitic capacitance 29 is charged while the constant currents $I_4$ flow through the constant current lines 4, and discharged while the supply of the constant current $I_4$ is stopped.

Figure 11:
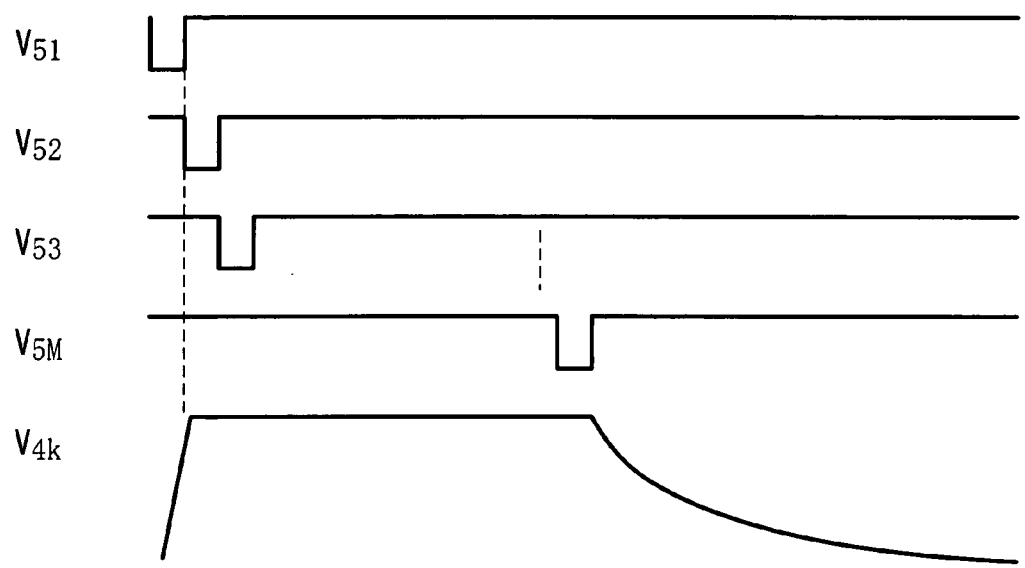
FIG. 11 is a graph showing a change in a potential of a constant current contained in the display device in the first embodiment of the present invention.

FIG. 11 is a graph showing the change in a potential $V_{4\,k}$ on the constant current line $4_k$ during one frame period. In the constant current write period, the constant currents $I_4$ are sequentially written onto the current hold circuits 9 of the pixels 12, column by column. The parasitic capacitance 29 is started to be discharged immediately after the completion of the writing of the constant current $I_4$ to the current hold circuits 9 of the pixels 12, for all the columns, and the potential $V_{4\,k}$ on the constant current line $4_k$ begins to be dropped.

As described in the first embodiment, sufficiently increasing the constant current $I_4$ flowing through the constant current line 4 eliminates the influence of the parasitic capacitance 29 on the programming of the current hold circuit 9 with the constant current; even when the parasitic capacitance 29 is discharged and thereby the potential on the constant current line 4 is decreased, there is no influence on the writing to the current hold circuit 9 of the constant current $I_4$ if the constant current $I_4$ is made sufficiently large.

In some cases, however, the organic EL elements 3 may not require the increase in the constant current $I_4$ flowing through the constant current line 4, namely, the drive current $I_9$, due to the properties thereof. For the architecture in which the constant current $I_4$ flowing through the constant current line 4 is not sufficiently increased, a considerable difference is induced between the constant current flowing into the constant current line 4 and the constant current supplied to the current hold circuit 9, because a part of the constant current $I_4$ is used to charge the parasitic capacitance 29. This involves that the constant current $I_4$ cannot be accurately written onto the current hold circuit 9.

Figure 1:
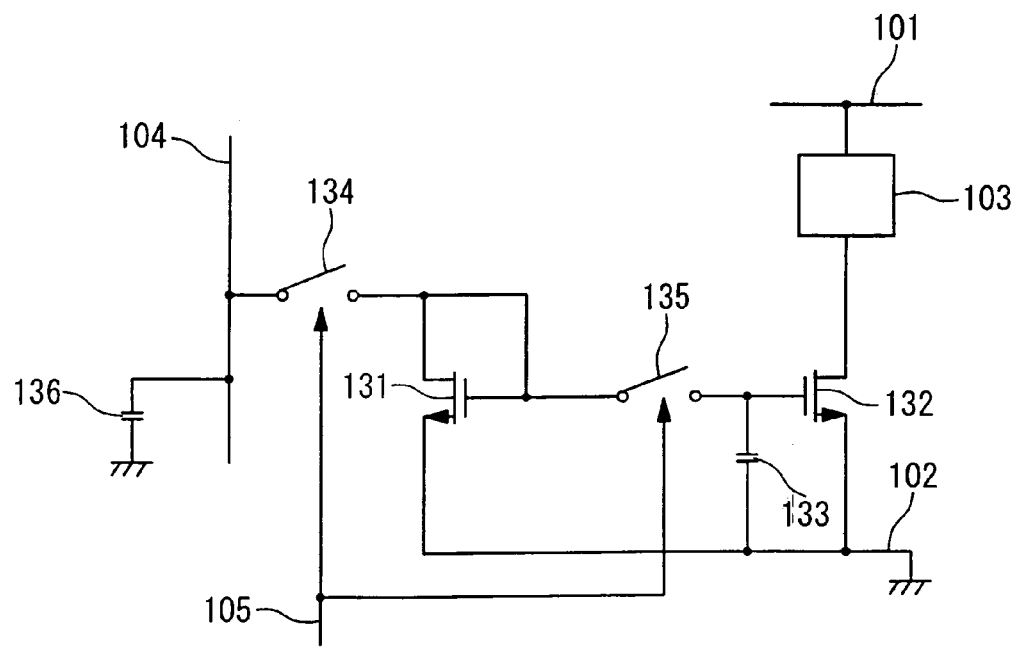
FIG. 1 is a circuit diagram illustrating a structure of a driving circuit of a conventional organic EL element.
Figure 2:
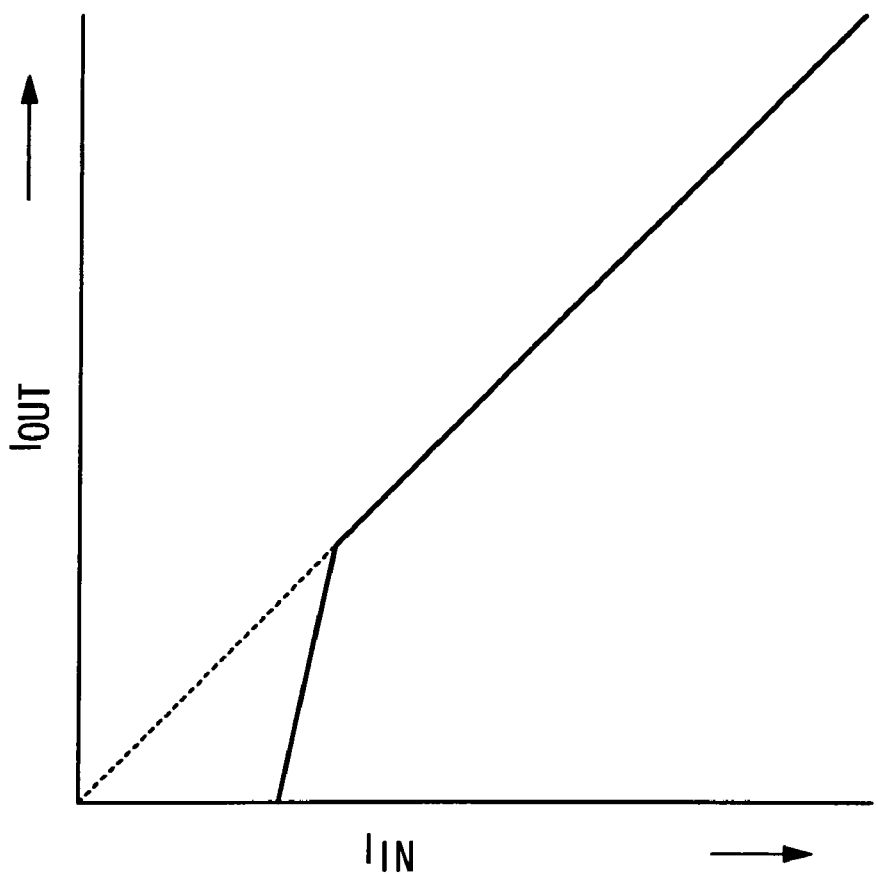
FIG. 2 is a graph showing an input/output property of the driving circuit of the conventional organic EL element.

In a second embodiment, in order to solve such problem, dummy pixels $12_{M+1,1}$ to $12_{M+1,N}$ (one shown) and a dummy constant current control line $5_{M+1}$ are additionally disposed within the display panel 50, as shown in FIG. 2. The dummy constant current control line $5_{M+1}$ is low active, as is the case of the constant current control line $5_M$.

Figure 13:
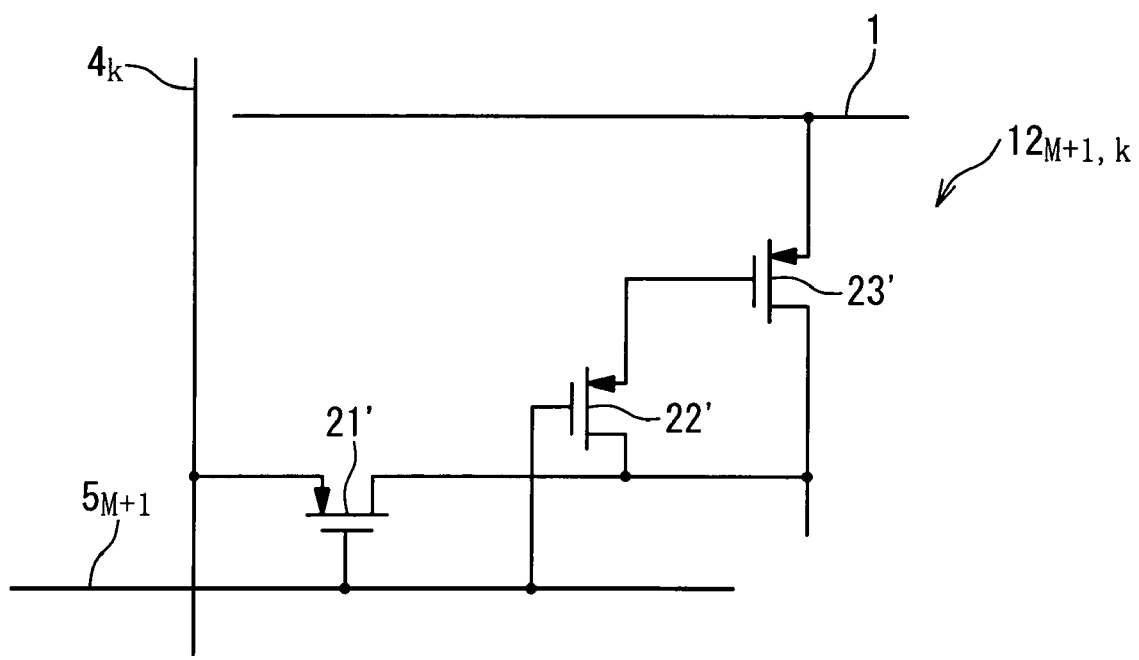
FIG. 13 is a circuit diagram of a dummy circuit contained in the display device in the second embodiment of the present invention.

FIG. 13 shows the configuration of the dummy pixel $12_{M+1,k}$. The dummy pixel $12_{M+1,k}$ is composed of P-channel MOS transistors 21' to 23', all of which are formed of TFTs. A source of the P-channel MOS transistor 23' is connected to the power supply terminal 1, while a gate and a drain of the P-channel MOS transistor 23' are connected to a source and a drain of the P-channel MOS transistor 22', respectively. A gate of the P-channel MOS transistor 22' is connected to the dummy constant current control line $5_{M+1}$. The P-channel MOS transistor 21' has a drain connected to the drains of the P-channel MOS transistor 22' and the P-channel MOS transistor 23', and a source connected to the constant current line $4_k$. A gate of the P-channel MOS transistor 21' is connected to the dummy constant current control line $5_{M+1}$.

Figure 14:
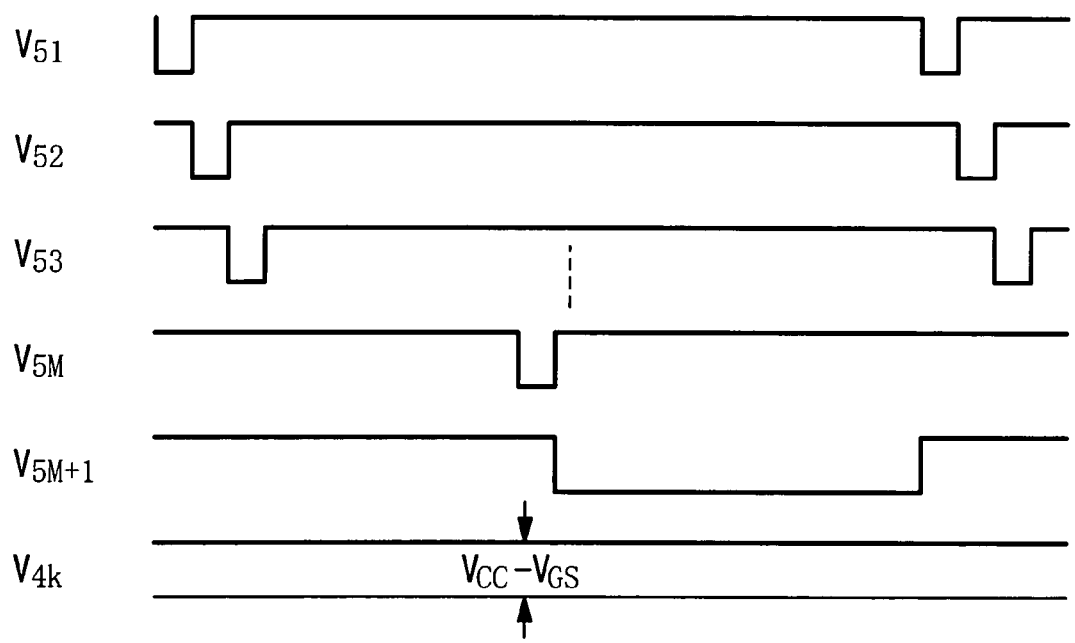
FIG. 14 is a timing chart illustrating operations of the display device in the second embodiment.

FIG. 14 is a timing chart showing the operation of the display device in this embodiment. During the constant current write period, the constant current control lines $5_1$ to $5_M$ are sequentially activated, and the constant currents $I_4$ are written onto the current hold circuits 9 of the pixels 12 for each column. It should be noted that the constant current control lines $5_1$ to $5_M$ are low active. The potential $V_4$ of the constant current line 4 while the constant current $I_4$ is written to the current hold circuit 9 is represented by the following equation:

$$V_4 = V_{CC} - V_{GS},$$

where $V_{CC}$ is the potential on the power supply terminal 1, and $V_{GS}$ is the source to gate voltage of the drive transistor 23 necessary for the drive transistor 23 to drive the drive current $I_9$ equal to the constant current $I_4$.

At the beginning of the constant current hold period, following the constant current write period, the dummy constant current control line $5_{M+1}$, which is low active, is activated; the potential $V_{5M+1}$ of the dummy constant current control line $5_{M+1}$ is pulled down to the low level. In response to the pull-down of the dummy constant current control line $5_{M+1}$, the P-channel MOS transistors 21' and 22' are turned on. The turn on of the P-channel MOS transistor 22' allows the P-channel MOS transistor 23' to be diode-connected. Additionally, the P-channel MOS transistor 23' is electrically connected to the constant current line 4 through turning on the P-channel MOS transistor 21', and this allows the constant current $I_4$ to flow from the power supply terminal 1 to the constant current line 4 through the P-channel MOS transistor 23'. Continuously developing the constant current $I_4$ on the constant current line 4 suppresses the discharge of the parasitic capacitance 29. This reduces the intensity of the current required to recharge the parasitic capacitance 29, and ideally eliminates the necessity for recharging the parasitic capacitance 29. Through the above-described operations, the dummy pixels $12_{M+1,1}$ to $12_{M+1,N}$ effectively solve the problem that the current hold circuit 9 is not accurately programmed with the constant current $I_4$ for the case when the constant current $I_4$ flowing through the constant current line 4 is small.

Preferably, the properties of the P-channel MOS transistor 23' of the dummy pixel $12_{M+1,k}$ are selected to be substantially equal to those of the drive transistor 23 of the pixel 12. More specifically, the size of the P-channel MOS transistor 23 is selected to be substantially equal to that of the drive transistor 23. This allows the source-to-gate voltages $V_{GS}$ of the P-channel MOS transistor 23' and the drive transistor 23 to be substantially equal to each other, and thereby the potential $V_4$ of the constant current line 4 is kept constant as shown in FIG. 14. This preferably eliminates the need for recharging the parasitic capacitance 29.

As explained above, the dummy pixels $12_{M+1,1}$ to $12_{M+1,N}$ suppress the decrease in the potential $V_4$ on the constant current line 4. Therefore, the dummy pixels $12_{M+1,1}$ to $12_{M+1, N}$ reduce the intensity of the current required to charge the parasitic capacitance 29, and ideally eliminate the need for charging the parasitic capacitance 29. This is especially useful in the case when the constant current $I_4$ flowing through the constant current line 4 is not allowed to be increased.

Third Embodiment

Figure 15:
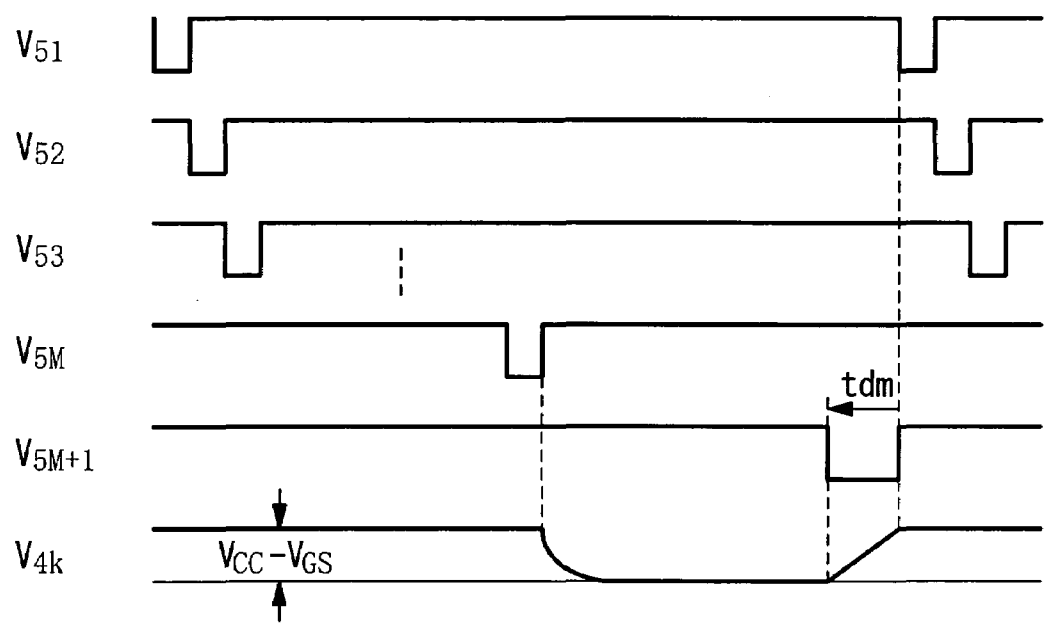
FIG. 15 is a timing chart illustrating operations of a display device in a third embodiment.

In a third embodiment, operations of the display device are modified in order to reduce the power consumption, as shown in the timing chart of FIG. 15. In this embodiment, the dummy constant current control line $5_{M+1}$ is not activated immediately after the end of the constant current write period (namely, immediately after the start of the constant current hold period); the potential $V_{5M+1}$ of the dummy constant current control line $5_{M+1}$ continues to be maintained at the high level. Since the dummy constant current control line $5_{M+1}$ is deactivated and the supply of the constant current $I_4$ is stopped, the potential of the constant current line 4 starts to be decreased.

The dummy constant current control line $5_{M+1}$ begins to be activated, a time of $t_{dm}$ before the end of the constant current hold period (namely, the start of a next constant current write period). The dummy constant current control line $5_{M+1}$ continues to be activated until the end of the constant current hold period, and is deactivated when the next constant current write period is started. The time $t_{dm}$ during which the dummy constant current control line $5_{M+1}$ is activated is set to be sufficiently larger than the time constant of charging the parasitic capacitance 29 so that the potential of the constant current line 4 reaches the potential of $V_{CC}$–$V_{GS}$. This eliminates the necessity of recharging the parasitic capacitance 29, and enables the desirable constant current $I_4$ to be written to the current hold circuit 9 of the pixel 12, as is the case of the second embodiment.

Additionally, the power consumption is effectively decreased in the third embodiment, since the constant current hold period includes the period while the supply of the constant current $I_4$ is stopped.

Fourth Embodiment

Figure 16:
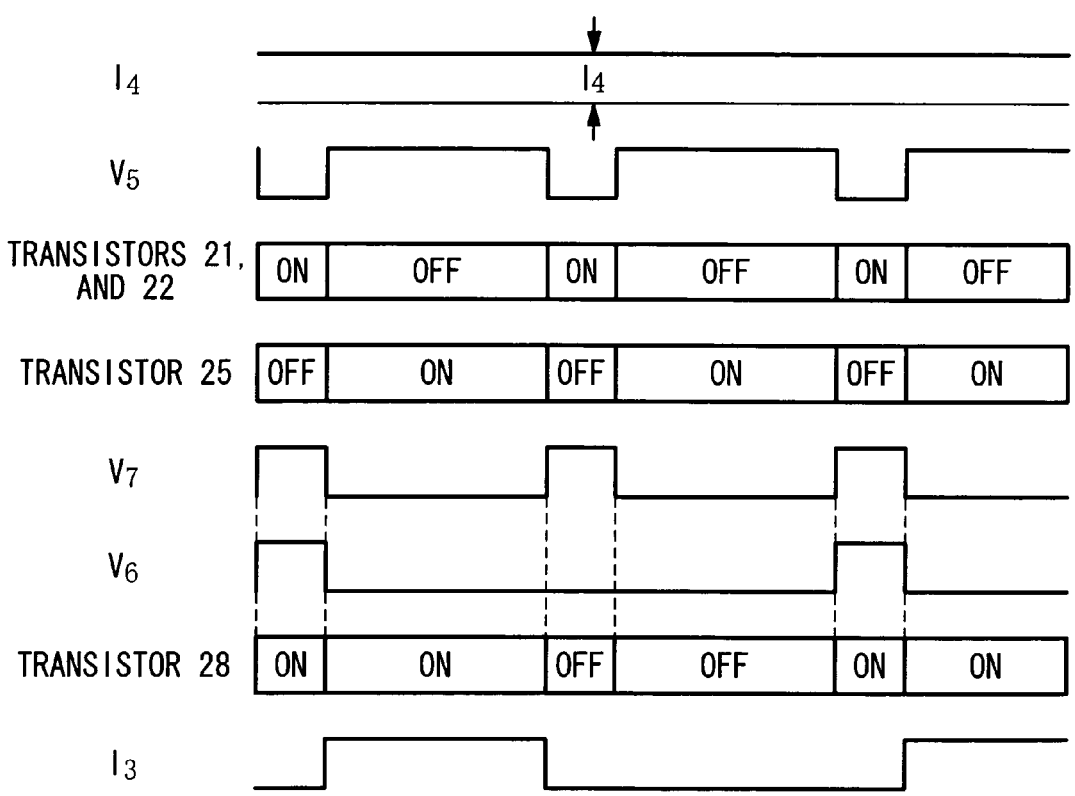
FIG. 16 is a timing chart illustrating operations of a display device in a fourth embodiment.

In a fourth embodiment, operations of the display device is modified as shown in FIG. 16 in order to suppress the influence of discharge of the capacitor element 24 within the current hold circuit 9; the configuration of the display device is equal to the first embodiment. The capacitor element 24 is discharged due to the minor leak thereacross, and this decrease the voltage across the capacitor element 24 during the constant current hold period. This is not preferable because the difference between the constant current $I_4$ and the drive current $I_9$ is increased, and thereby the accuracy in the grayscale level of the pixel 12 is deteriorated.

In order to sustain the voltage across the capacitor element 24, in the fourth embodiment, the current hold circuit 9 is programmed with the constant current $I_4$ multiple times for one frame period, as shown in FIG. 16. The constant current control line 5 is activated when the data signal is written through the data line 6 onto the potential hold circuit 10, namely, while the data-line control line 7 is activated, and thereby the current hold circuit 9 is programmed with the constant current $I_4$. Repeatedly programming the current hold circuit 9 with the constant current $I_4$, namely, repeatedly charging the parasitic capacitance 29 suppresses the decrease in the voltage across the capacitor element 24 during the constant current hold period. This reduces the difference between the constant current $I_4$ and the drive current $I_9$, and improves the accuracy in the graylevel of the pixel 12.

Fifth Embodiment

Figure 12:
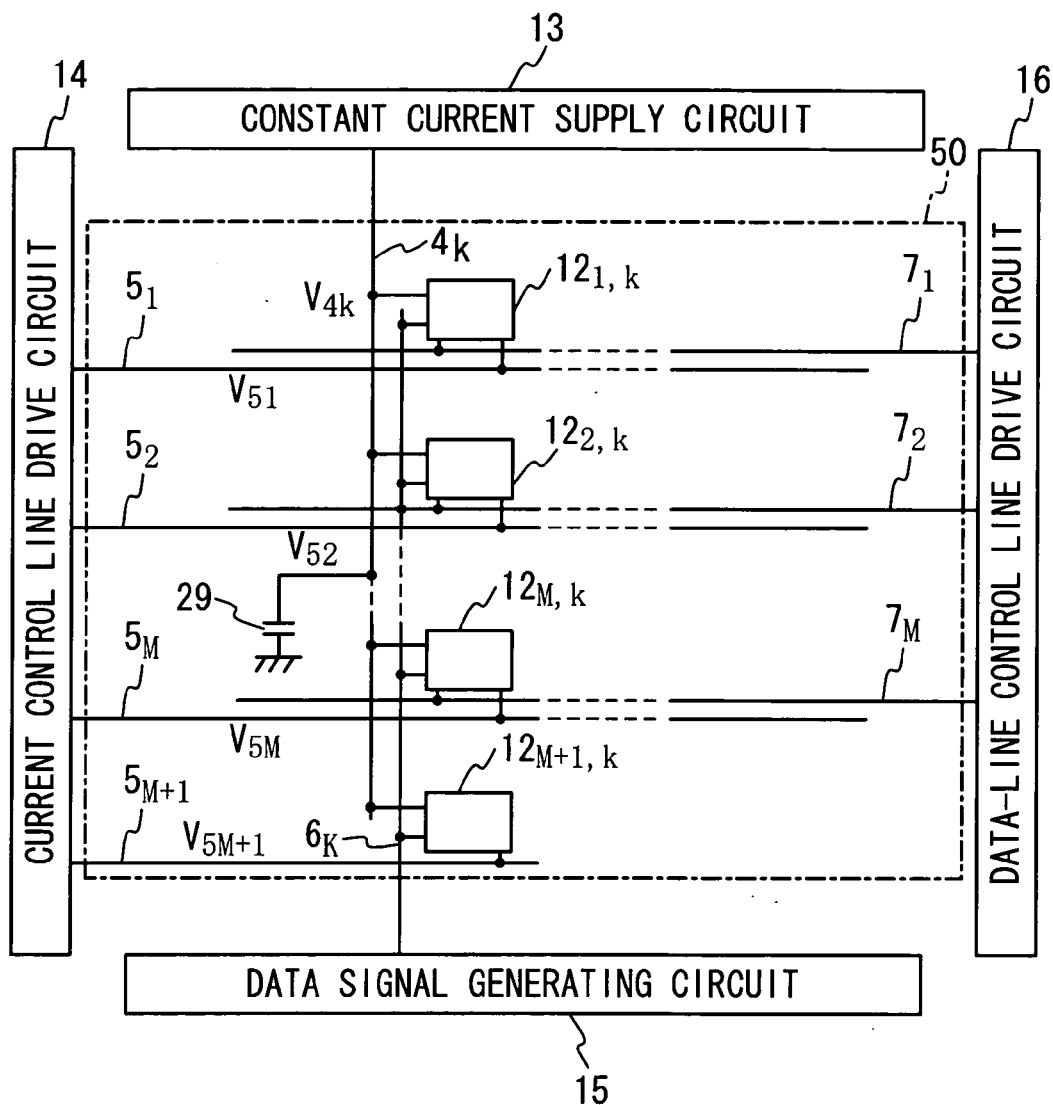
FIG. 12 is a circuit diagram illustrating a structure of a display device in the second embodiment of the present invention.
Figure 17:
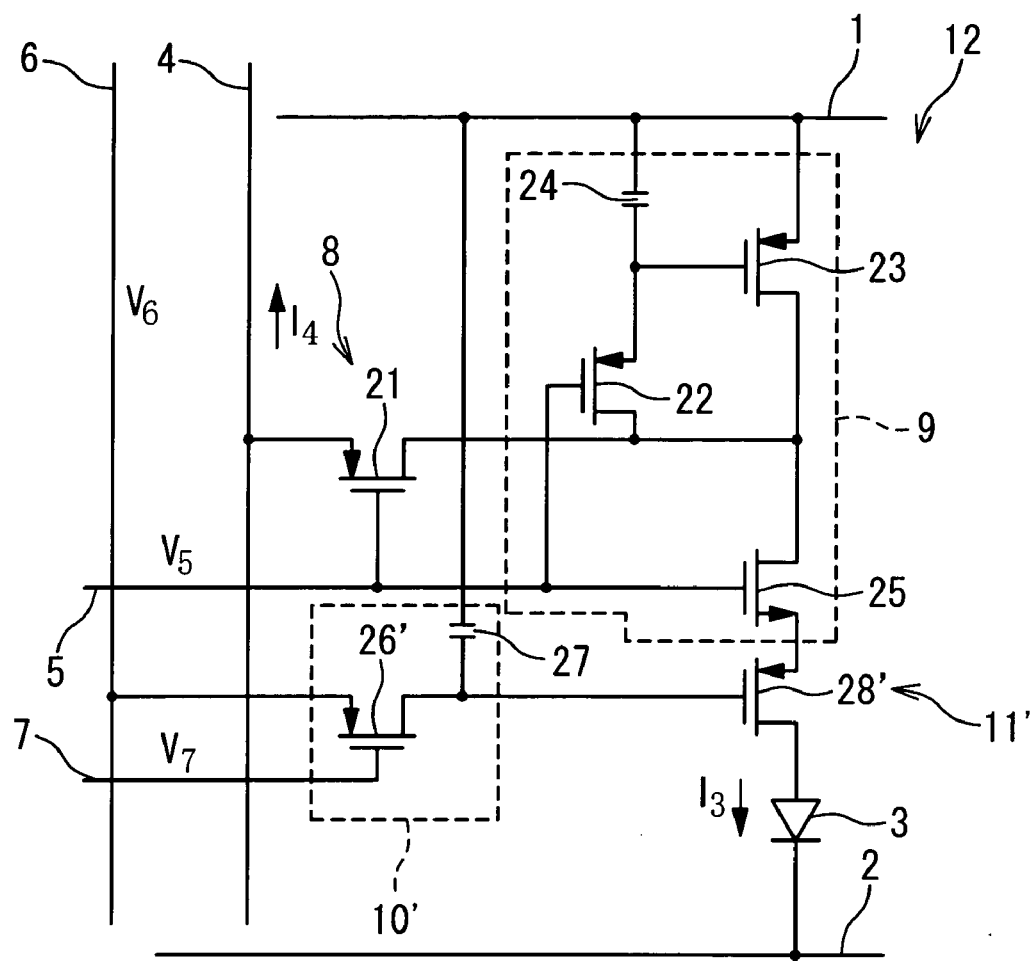
FIG. 17 is a circuit diagram illustrating a structure of a pixel contained in a display device in a fifth embodiment.
Figure 18:
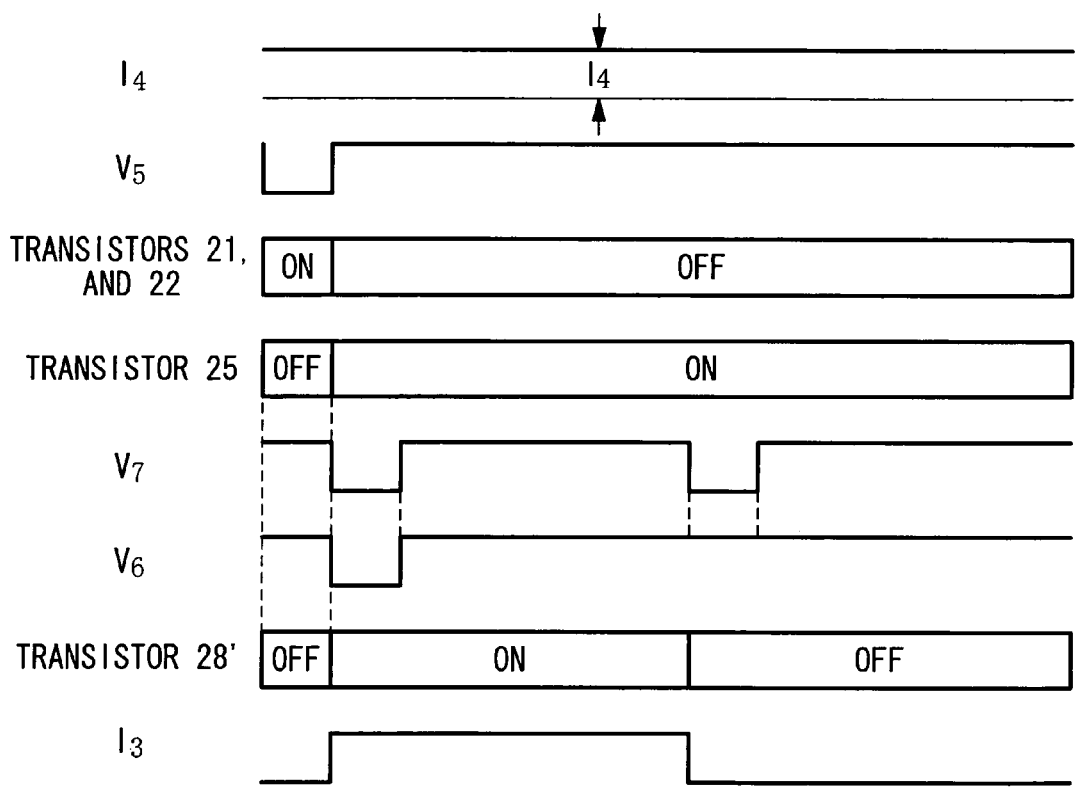
FIG. 18 is a timing chart illustrating operations of the display device in the fifth embodiment.

In a fifth embodiment, as shown in FIG. 17, the channel conductivity types of some of TFTs contained in the pixel 12 are altered. In detail, the N-channel MOS transistor 26 within the potential hold circuit 10 is replaced with a P-channel MOS transistor 26', and the N-channel MOS transistor 28 constituting the switch 11 is replaced with a P-channel MOS transistor 28'. This is accompanied by that the data line 6 and the data-line control line 7 are changed to be low active. That is, as shown in FIG. 18, the polarities of the data signal transmitted through the data line 6 and the signal generated on the data-line control line 7 are inverted. It is apparent to those skilled in the art that the pixel 12 shown in FIG. 17 is substantially equivalent to the pixel 12 shown in FIG. 12.

Sixth Embodiment

Figure 19:
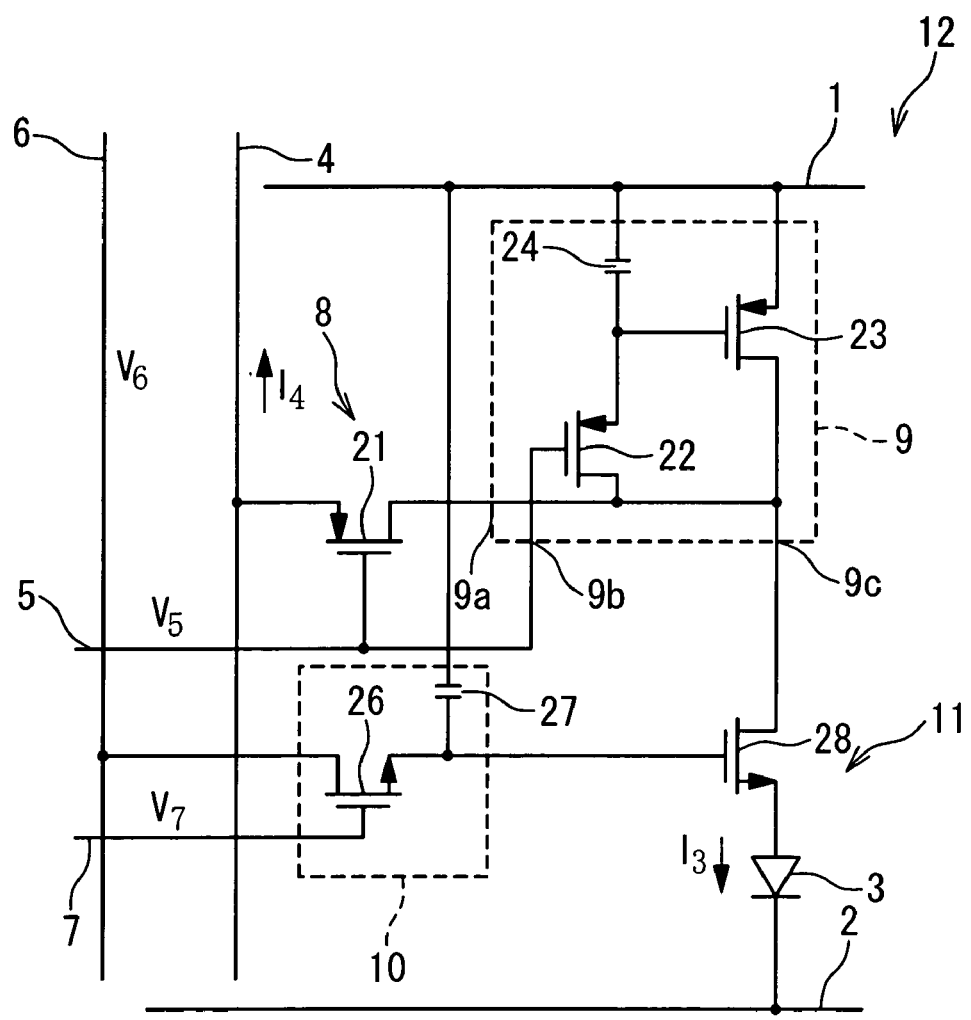
FIG. 19 is a circuit diagram illustrating a structure of a pixel contained in a display device in a sixth embodiment.

In a sixth embodiment, as shown in FIG. 19, the N-channel MOS transistor 25 is removed from the pixel 12 in order to reduce the number of the elements disposed within the pixel 12. The reduction in the number of the elements constituting the pixel 12 is important to improve the open area ratio of the display panel 50. In detail, the drains of the P-channel MOS transistor 22 and the drive transistor 23 are directly connected to the current output 9c of the current hold circuit 9. This results in that the drain of the N-channel MOS transistor 28 is directly connected to the drain of the drive transistor 23.

Figure 20:
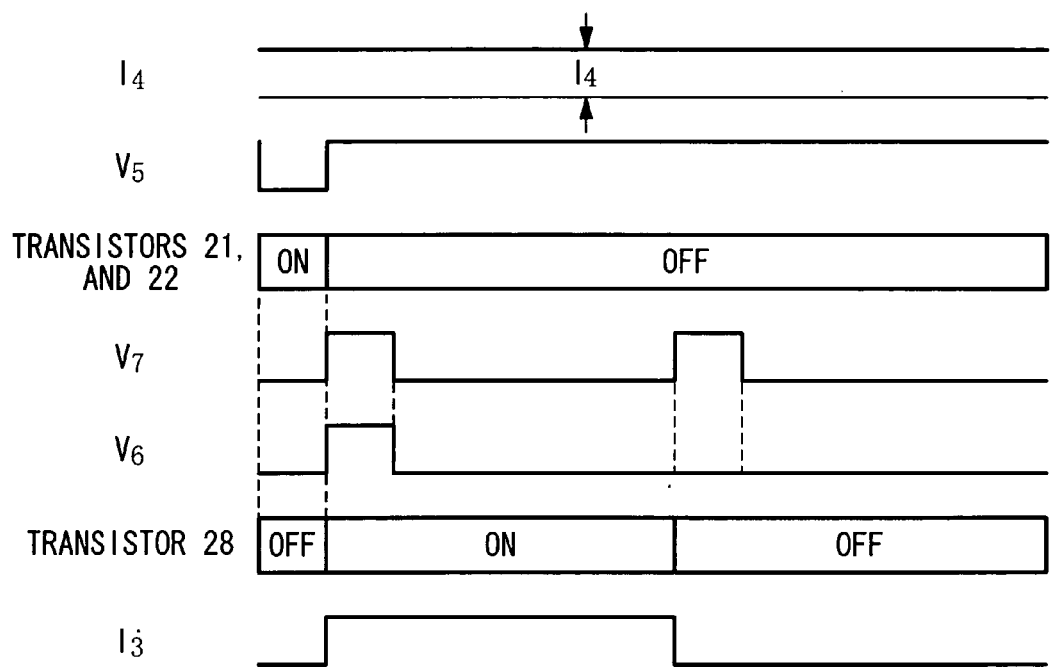
FIG. 20 is a timing chart illustrating operations of the display device in the sixth embodiment.

The removal of the N-channel MOS transistor 25 requires preventing a current from flowing through the organic EL element 3 during programming the current hold circuit 9 with the constant current $I_4$ through the constant current line 4. In order to preventing the current from flowing through the organic EL element 3, as shown in FIG. 20, the potential of the data signal inputted to the potential hold circuit 10 through the data line 6 and the potential on the data-line control line 7 are both selected so as to turn off the N-channel MOS transistor 28 while the current hold circuit 9 is programmed with the constant current $I_4$. In other words, the data signal and the data-line control line 7 are both maintained at the low level during programming the current hold circuit 9 with the constant current $I_4$. This prevents a current from flowing through the organic EL element 3 while the current hold circuit 9 is programmed with the constant current $I_4$ through the constant current line 4.

Seventh Embodiment

Figure 21:
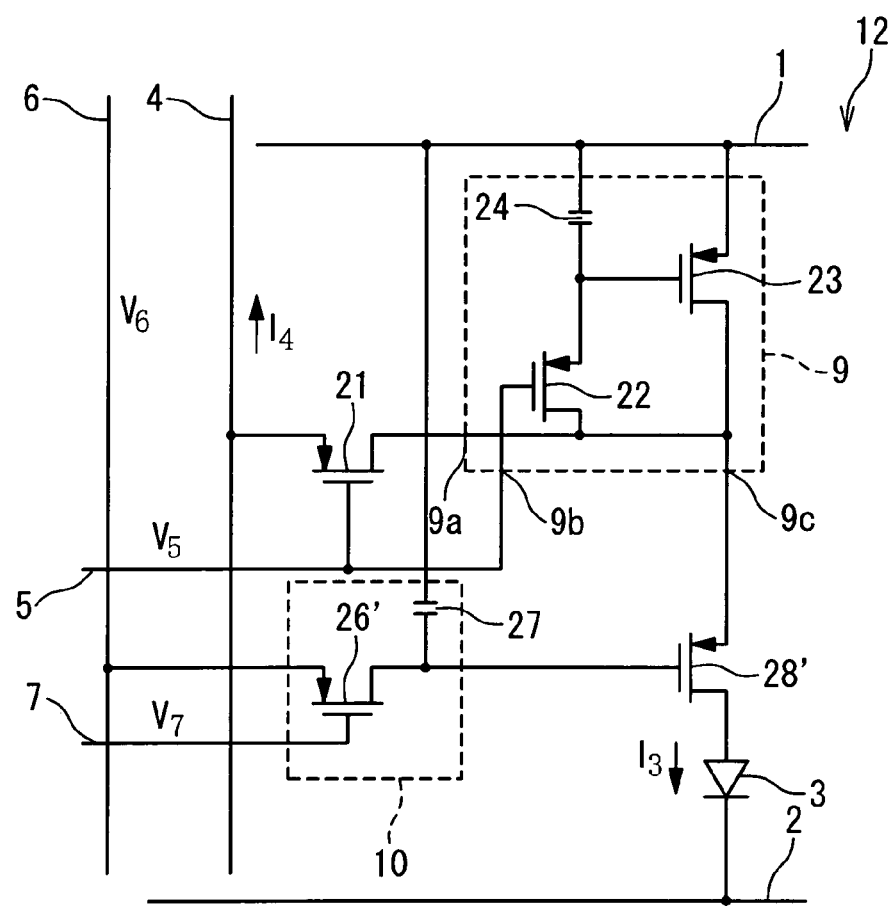
FIG. 21 is a circuit diagram illustrating a structure of a pixel contained in a display device of a seventh embodiment.

FIG. 21 shows the configuration of the pixel 12 in a seventh embodiment. The configuration of the pixel 12 in the seventh embodiment is almost identical to the configuration shown in FIG. 19, in exception that the N-channel MOS transistors 26, 28 are replaced with the P-channel MOS transistors 26', 28'. Since the N-channel MOS transistor 25 is removed, and the N-channel MOS transistors 26, 28 are further replaced with the P-channel MOS transistors 26', 28', the TFTs contained in the pixel 12 have the same conductivity type. This reduces the number of the steps required to fabricate the TFTs within the display panel 50, and is advantageous in terms of the yield and cost.

Figure 22:
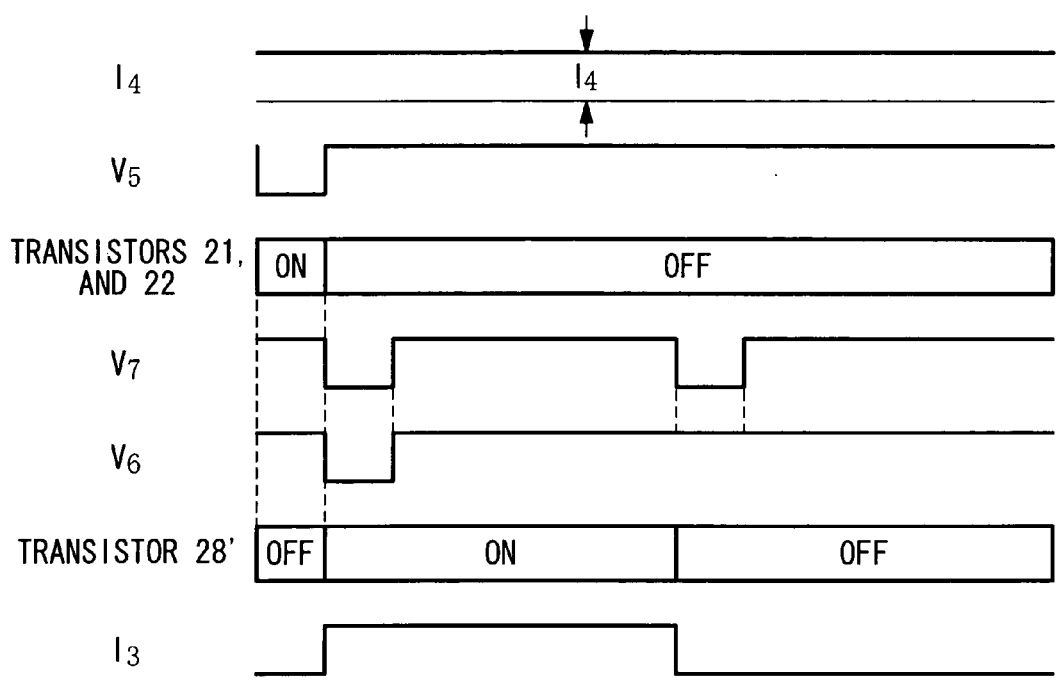
FIG. 22 is a timing chart illustrating operations of the display device in the seventh embodiment.

In association with the fact that the N-channel MOS transistors 26, 28 are replaced with the P-channel MOS transistors 26', 28', as shown in FIG. 22, the data signal transmitted through the data line 6, and the data-line control line 7 are modified to be low active. That is, the polarities of the data signal transmitted through the data line 6 and the signal generated on the data-line control line 7 are inverted. This prevents a current from flowing through the organic EL element 3 during programming the current hold circuit 9 with the constant current $I_4$ from the constant current line 4.

Eighth Embodiment

Figure 23:
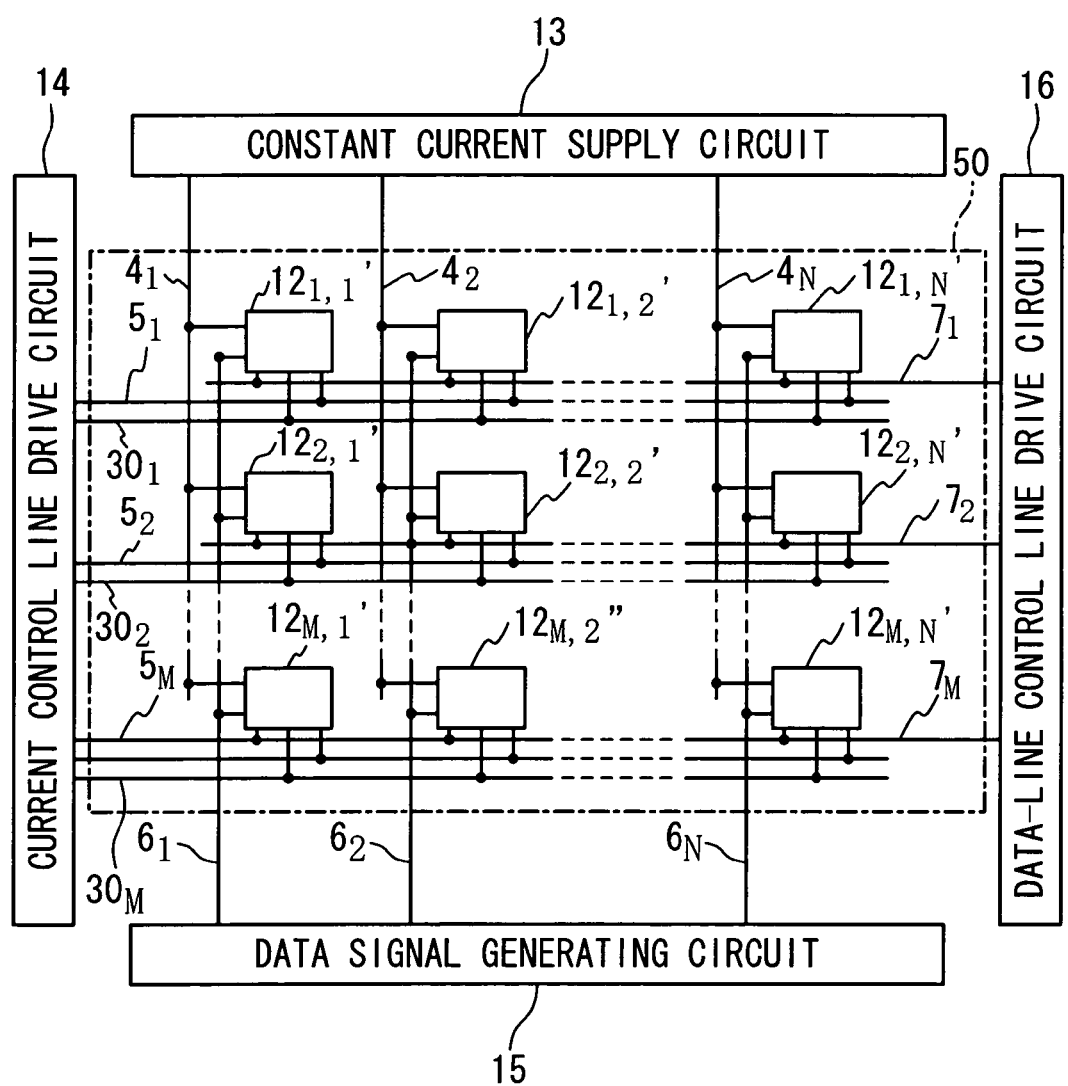
FIG. 23 is a circuit diagram illustrating a structure of a display device in an eighth embodiment.

FIG. 23 shows the configuration of the display device in an eighth embodiment. In the eighth embodiment, M sub constant current control lines 30 are additionally disposed within the display panel 50, and the pixels 12 are further replaced with pixels 12'. If necessary, the sub constant current control lines 30 and the pixels 12' may be distinguished from each other with a subscript.

The potentials complementary to those on the constant current control lines 5 are developed on the sub constant current control lines 30. As described later, the sub constant current control lines 30 are used to prevent a current from flowing through the organic EL elements 3 during programming the current hold circuits 9 with the constant currents $I_4$.

Figure 24:
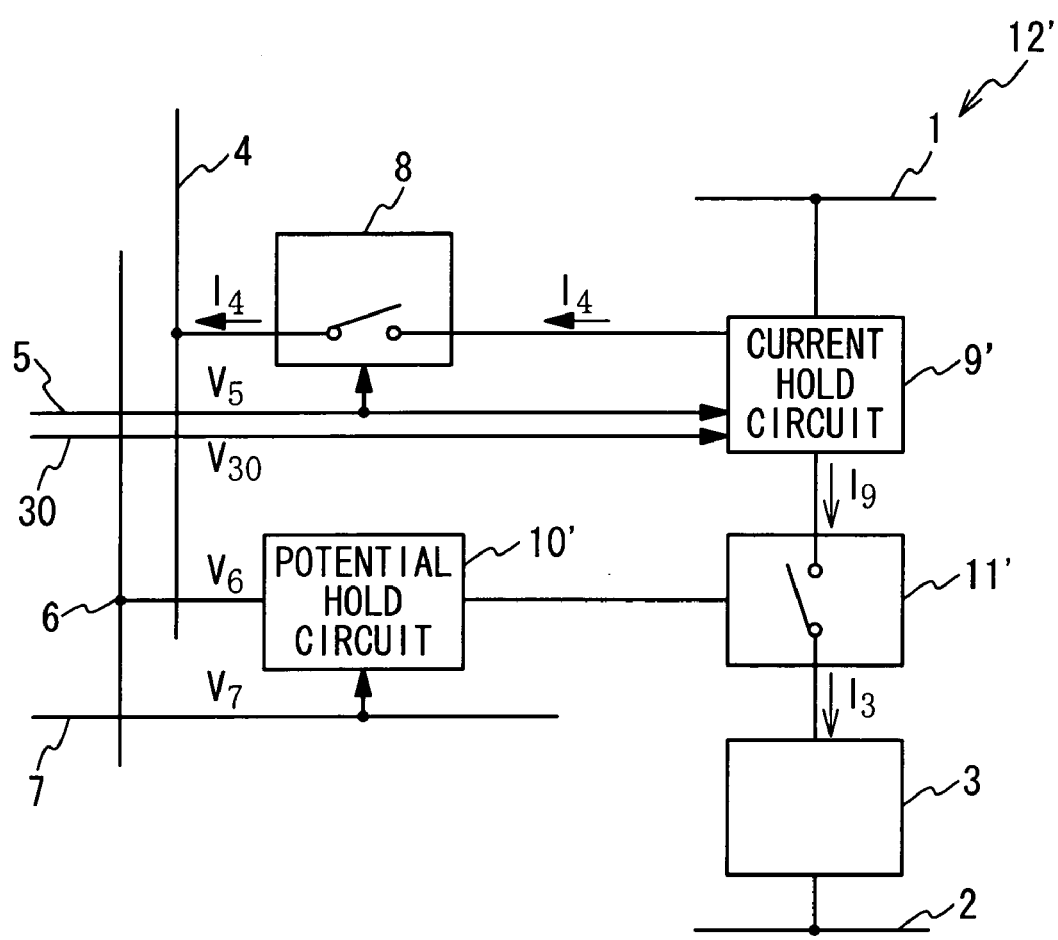
FIG. 24 is a circuit diagram illustrating a structure of a pixel contained in the display device in the eighth embodiment.

FIG. 24 shows the configuration of the pixel 12'. The structure of the pixel 12' is almost identical to the pixel 12 in the first embodiment, in exception that the current hold circuit 9, the potential hold circuit 10, and the switch 11 are replaced with a current hold circuit 9', a potential hold circuit 10', and a switch 11', and that the sub constant current control line 30 is connected to control input 9c' of the current hold circuit 9' in place of the constant current control line 5.

Figure 25:
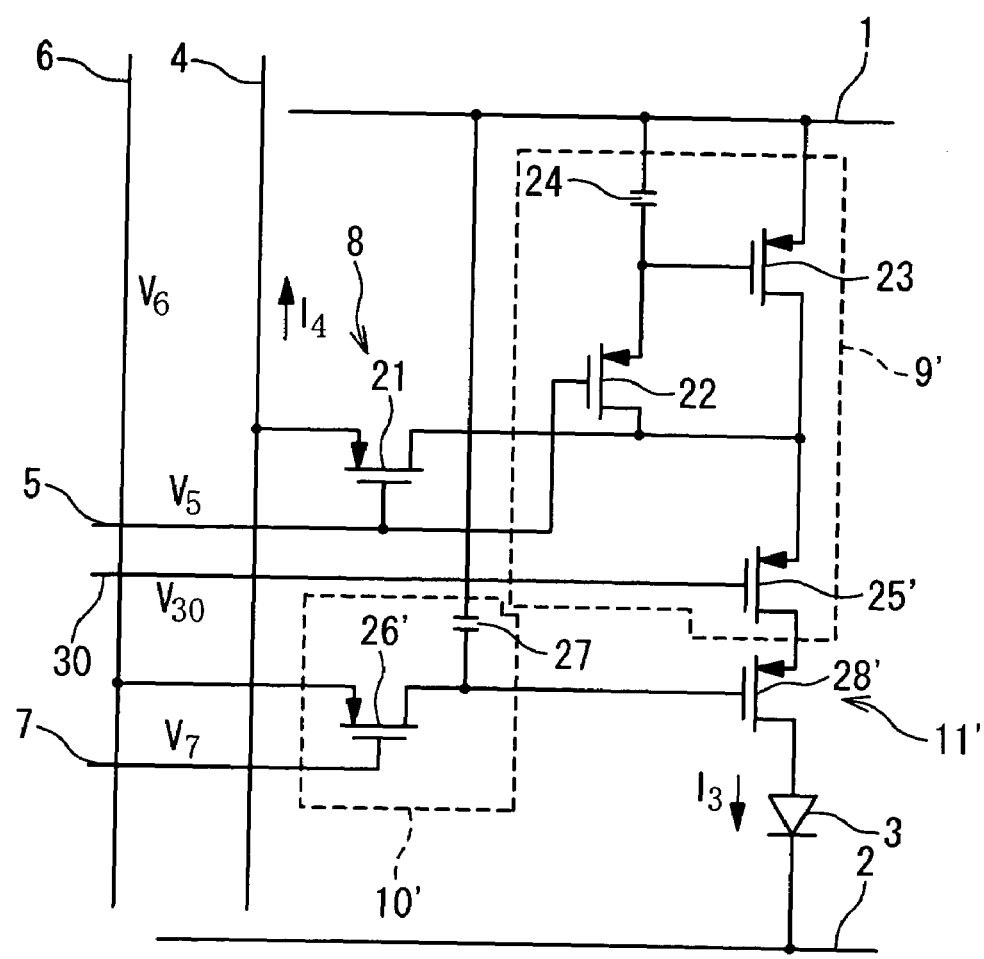
FIG. 25 is a circuit diagram illustrating the detailed structure of the pixel contained in the display device in the eighth embodiment.

FIG. 25 shows the detailed configuration of the pixel 12'. The following is a description on the difference between the pixel 12 in the first embodiment and the pixel 12'. The N-channel MOS transistors 25, 26 and 28 are replaced with the P-channel MOS transistors 25', 26' and 28', and the sub constant current control line 30 is connected to a gate of the P-channel MOS transistor 25'.

The aforementioned configuration of the pixel 12' has an advantage that all the TFTs within the pixel 12' have the same conductivity type. As mentioned above, the fact that all the TFTs have the same conductivity type reduces the number of the steps required to form the TFTs in the display panel 50, and this is advantageous in terms of the yield and cost. The use of the sub constant current control line 30, which are complementary to the constant current control line 5, is important for allowing all the TFTs contained in the pixel 12' to have the same conductivity type. The use of the sub constant current control line 30, complementary to the constant current control line 5, enables the P-channel MOS transistor 25' to be used in place of the N-channel MOS transistor 25.

Figure 26:
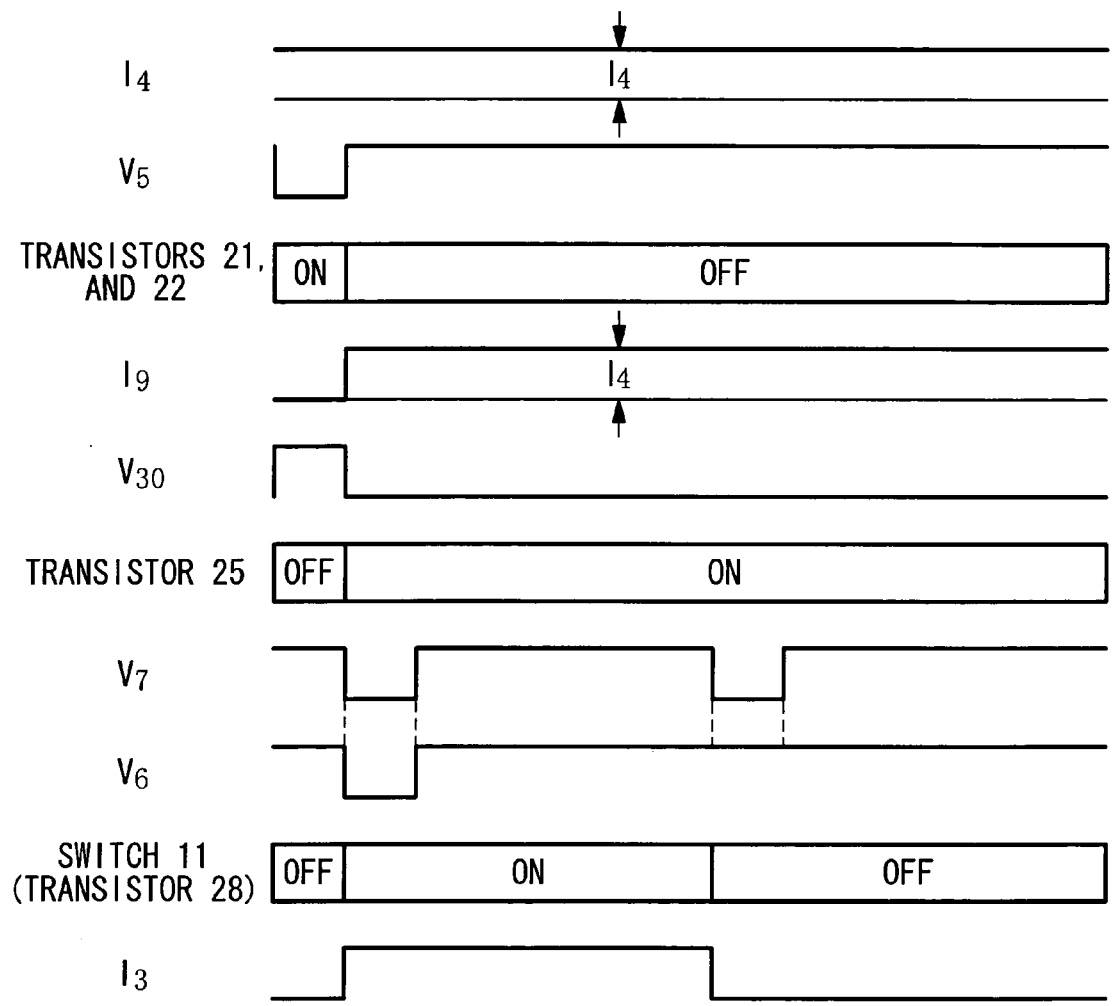
FIG. 26 is a timing chart illustrating operations of the display device in the eighth embodiment.

FIG. 26 is a timing chart showing operations of the display device in the eighth embodiment. The operation of the display device in the eighth embodiment is equal to the operation of the display device in the first embodiment shown in FIG. 6, except for that the P-channel MOS transistor 25' is operated in response to the sub constant current control line 30 having the potential complementary to the potential of the constant current control line 5, and that the potentials of the data-line control line 7 and the data signal supplied to the pixel 12' from the data line 6 are complementary to those in the first embodiment.

Ninth Embodiment

Figure 27:
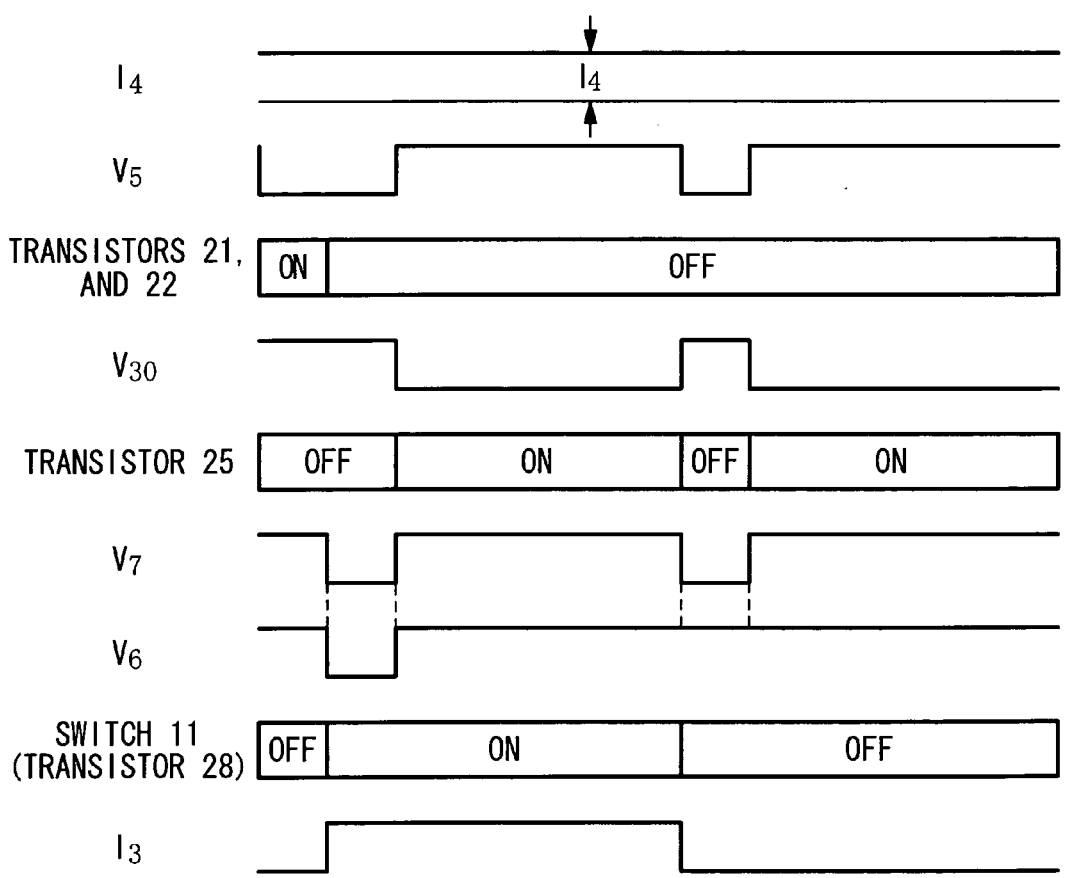
FIG. 27 is a timing chart illustrating operations of a display device in a ninth embodiment.

In a ninth embodiment, operations of the display device is modified as shown in FIG. 27 in order to suppress the influence of discharge of the capacitor element 24 within the current hold circuit 9' in the eighth embodiment. The configuration of the display device in the ninth embodiment is equal to that in the eighth embodiment.

In the ninth embodiment, as shown in FIG. 27, in order to maintain the voltage of the capacitor element 24, the current hold circuit 9 is programmed with the constant current $I_4$ multiple times for one frame period. The constant current control line 5 is activated when the data signal is written through the data line 6 onto the potential hold circuit 10, namely, while the data-line control line 7 is activated, and thereby the current hold circuit 9 is programmed with the constant current $I_4$. Simultaneously with the activation of the constant current control line 5, the potential complementary to the constant current control line 5 is generated on the sub constant current control line 30, and thereby the P-channel MOS transistor 25' is turned off. This prevents a current from flowing through the organic EL element 3.

In the ninth embodiment, the programming of the current hold circuit 9 with the constant current $I_4$, namely, the charging of the capacitor element 24 is repeatedly executed, and thereby the decrease in the voltage across the capacitor element 24 is suppressed during the constant current hold period. This decreases the difference between the constant current $I_4$ and the drive current $I_9$, and improves the accuracy in the graylevel of the pixel 12.

Although the schema of the present invention and the preferable embodiments thereof have been described above, it should be noted that the variation are allowed within the scope of the invention disclosed in the claims. In particular, it is apparent to those skilled in the art that other current-driven elements may be used in place of the organic EL elements 3.

The invention claimed is:

1. A display panel comprising:
    a current-driven display element;
    a constant current control line;
    a constant current line providing constant current continuously;
    a current hold circuit outputting, when said constant current control line is deactivated, a drive current having an intensity substantially identical to that of a constant current provided thereto through said constant current line in the case that said constant current control line is activated;
    a switch circuit connected between said current-driven display element and said current hold circuit;
    a data line transmitting a data signal having a waveform corresponding to a grayscale level;
    a control circuit provided with said data signal, wherein said control circuit turns on and off said switch circuit in response to said data signal.

2. The display panel according to claim 1, wherein transistors contained within said current hold circuit, said switch circuit, and said control circuit are all TFTs.

3. The display panel according to claim 1, further comprising:
    an additional switch circuit connected between said constant current line and said current hold circuit,
    wherein said current hold circuit is connected to a power supply terminal, and
    wherein said additional switch circuit electrically connects said constant current line with said current hold circuit, and thereby allows said constant current to flow from said power supply terminal to said constant current line through said current hold circuit.

4. The display panel according to claim 3, wherein all MOS transistors contained within said current hold circuit, said switch circuit, said additional switch circuit, and said control circuit have the same conductivity type.

5. The display panel according to claim 3, wherein said additional switch circuit includes a first MOS transistor, and
wherein said first MOS transistor has a first source/drain connected to said constant current line, a second source/drain connected to said current hold circuit, and a gate connected to said constant current control line.

6. The display panel according to claim 3, wherein said current hold circuit includes a drive MOS transistor, a first capacitor element, a second MOS transistor,
wherein said drive MOS transistor has a source connected to a power supply terminal, a drain connected to said switch circuit and said additional switch circuit,
wherein said first capacitor element is connected between a gate and source of said drive MOS transistor, and
wherein a source and a drain of said second MOS transistor are connected to said gate and drain of said drive MOS transistor, respectively, while a gate of said second MOS transistor is connected to said constant current control line.

7. The display panel according to claim 6, wherein said constant current flows from said power supply terminal to said constant current line through said drive MOS transistor, and said additional switch circuit, and thereby said first capacitor element is charged to a source-to-gate voltage of said drive MOS transistor, and
wherein said constant current is supplied for said current hold circuit multiple times for one frame period.

8. The display panel according to claim 7, wherein said constant current is supplied for said current hold circuit every time said data signal is provided for said control circuit.

9. The display panel according to claim 6, wherein said current hold circuit additionally includes a third MOS transistor, and
wherein said third MOS transistor has a first source/drain connected to said drain of said drive MOS transistor,
wherein a first source/drain of said third MOS transistor is connected to said switch circuit, and
wherein said third MOS transistor has a gate connected to said constant current control line.

10. The display panel according to claim 6, further comprising a sub constant current control line having a potential complementary to a potential on said constant current control line,
wherein said current hold circuit additionally includes a third MOS transistor, and
wherein said third MOS transistor has a first source/drain connected to said drain of said drive MOS transistor, a second source/drain connected to said switch circuit, and a gate connected to said sub constant current control line, and
wherein conductivity types of said first MOS transistor, said second MOS transistor, and said third MOS transistor are same.

11. The display panel according to claim 1, further comprising a data-line control line,
wherein said control circuit includes a potential hold circuit outputting a potential substantially identical to a potential of said data signal from a signal output when said data line control line is activated, and holding a potential on said signal output when said data line control line is deactivated, and
wherein said switch circuit is turned on and off, in response to said potential on said signal output of said potential hold circuit.

12. The display panel according to claim 11, wherein said switch circuit includes a fourth MOS transistor,
wherein said fourth MOS transistor has a first source/drain connected to said current hold circuit, and a second source/drain connected to said current-driven display element,
wherein said potential hold circuit includes:
a fifth MOS transistor, and
a second capacitor element,
wherein said fifth MOS transistor has a first source/drain connected to said data line, a second source/drain connected to said signal output, and a gate connected to said data-line control line, and
wherein said second capacitor element is connected between a power supply terminal and said signal output.

13. The display panel according to claim 1, further comprising a dummy circuit connected to said constant current line,
wherein said dummy circuit is provided with said constant current through said constant current line during an inactive period while said constant current control line is deactivated.

14. The display panel according to claim 13, further comprising a dummy constant current control line which is activated during an inactive period while said constant current control line is deactivated,
wherein said dummy current includes:
a drive transistor,
a first MOS transistor, and
a second MOS transistor,
wherein said first MOS transistor has a first source/drain connected to said constant current line, and a gate connected to said dummy constant current control line,
wherein said drive MOS transistor has a source connected to a power supply terminal, and a drain connected to a second/source drain of said first MOS transistor, and
wherein said second MOS transistor has a source and a drain connected to a gate and said drain connected to said drive MOS transistor, respectively, and a gate connected to said dummy constant current control line.

15. The display panel according to claim 1, further comprising a dummy pixel connected to said constant current line,
wherein said dummy pixel is provided with said constant current through said constant current line during a predetermined period immediately before said constant current control line is activated, out of an inactive period while said constant current control line is deactivated.

16. The display panel according to claim 14, wherein said predetermined period is longer than a time constant of charging a parasitic capacitor of said constant current line.

17. The display panel according to claim 1, wherein said current-driven display element is an organic EL element.

18. A driving method for a display panel including:
a current-driven display element,
a drive MOS transistor,
a capacitor element connected between a gate and a source of said drive MOS transistor,
a first switch connected between a drain and said gate of said drive MOS transistor, and a second switch connected between said drain of said drive MOS transistor and the current-driven display element, said method comprising:

a first step of developing a constant current through said drive MOS transistor with said first switch turned on and with said second switch turned off, a second step of providing a drive current for said current-driven display element with said first switch turned off and with said second switch turned on.

19. The driving method according to claim 18, wherein said display panel further includes a constant current line, and wherein said constant current is provided for said drive MOS transistor through said constant current line.

20. The driving method according to claim 18, wherein said first step is performed multiple times for one frame period.

* * * * *